(12) United States Patent
Itou

(10) Patent No.: US 6,945,258 B2
(45) Date of Patent: Sep. 20, 2005

(54) SUBSTRATE PROCESSING APPARATUS AND METHOD

(75) Inventor: Kouichi Itou, Tosu (JP)

(73) Assignee: Tokyo Electron Limited, Tokyo (JP)

( * ) Notice: Subject to any disclaimer, the term of this patent is extended or adjusted under 35 U.S.C. 154(b) by 470 days.

(21) Appl. No.: 10/124,596

(22) Filed: Apr. 18, 2002

(65) Prior Publication Data

US 2002/0153027 A1 Oct. 24, 2002

(30) Foreign Application Priority Data

Apr. 19, 2001 (JP) ........................................ 2001-120613

(51) Int. Cl.[7] ................................................. B08B 3/00
(52) U.S. Cl. ..................... 134/56 R; 134/57 R; 134/61; 134/62; 134/66; 134/113; 134/902; 118/668; 414/222.01; 414/222.02; 414/222.03; 414/222.07
(58) Field of Search ............................. 134/56 R, 57 R, 134/61, 62, 66, 113, 902; 118/668; 414/222.01, 222.02, 222.03, 222.07

(56) References Cited

U.S. PATENT DOCUMENTS

| | | | |
|---|---|---|---|
| 5,015,177 A | * | 5/1991 | Iwata ........................ 432/121 |
| 5,498,294 A | | 3/1996 | Matsushita et al. |
| 5,518,542 A | | 5/1996 | Matsukawa et al. |
| 5,686,143 A | | 11/1997 | Matsukawa et al. |
| 5,700,127 A | * | 12/1997 | Harada et al. ......... 414/416.08 |

FOREIGN PATENT DOCUMENTS

JP 9-17838 * 1/1997

OTHER PUBLICATIONS

H.Hansen et al. Transport mechanism for auto control of sequential dipping operation. IBM Technical Disclosure Bulletin. vol. 23, No. 7A, Dec. 1980.*

* cited by examiner

Primary Examiner—M. Kornakov
(74) Attorney, Agent, or Firm—Smith, Gambrell & Russell LLP

(57) ABSTRACT

A cleaning processing system including a wafer transfer device, a wafer detecting sensor for detecting a wafer, a memory for storing the position and direction of an extra wafer present inside the cleaning processing system when the power supply is cut off, an alarm device for generating an alarm in the case where the information detected by the wafer detecting sensor when the power supply to the cleaning processing system is turned on differs from the wafer information taken out of the memory, an alarm canceling section for canceling the alarm, an apparatus control section for controlling the wafer transfer device to recover the extra wafer, and a recovery start-up section for emitting an instruction to start the wafer recovery to the apparatus control section.

28 Claims, 10 Drawing Sheets

FIG.8A

| PRA 15 | RVS 14d W5?-S15 | CRA 13 | F1 |
| --- | --- | --- | --- |
| | RVS 14c W4R-S14 | | S:15 |
| W6?-S16 | TRS 14b | | |
| | TRS 14a | | |
| SCR 21c W1-S11 | SCR 21d W2-S12 | | |
| SCR 21a | SCR 21b W3R-S13 | | |
| DATA COMPILATION | WAFER RECOVERY | | |

FIG.8B

| PRA 15 | RVS 14d W5?-S15 | CRA 13 | F1 |
| --- | --- | --- | --- |
| | RVS 14c W4R-S14 | | S:15 |
| W6?-S16 | TRS 14b | | |
| | TRS 14a | | |
| SCR 21c W1-S11 | SCR 21d W2-S12 | | |
| SCR 21a | SCR 21b W3R-S13 | | |
| WAFER DELETION | WAFER ADDITION | REVERSAL OF WAFER | CHANGE OF SLOT |

FIG.8C

| PRA 15 | RVS 14d W5?-S15 | CRA 13 | F1 |
| --- | --- | --- | --- |
| | RVS 14c W4R-S14 | | S:15 |
| ▓W6?-S16▓ | TRS 14b | | |
| | TRS 14a | | |
| SCR 21c W1-S11 | SCR 21d W2-S12 | | |
| SCR 21a | SCR 21b W3R-S13 | | |
| WAFER DELETION | IS W6 DELETED? YES/NO | | |

FIG.8D

| PRA 15 | RVS 14d W5?-S15 | CRA 13 | F1 |
| --- | --- | --- | --- |
| | RVS 14c W4R-S14 | | S:15 |
| | TRS 14b | | |
| | TRS 14a | | |
| SCR 21c W1-S11 | SCR 21d W2-S12 | | |
| SCR 21a | SCR 21b W3R-S13 | | |
| DATA COMPILATION | WAFER RECOVERY | | |

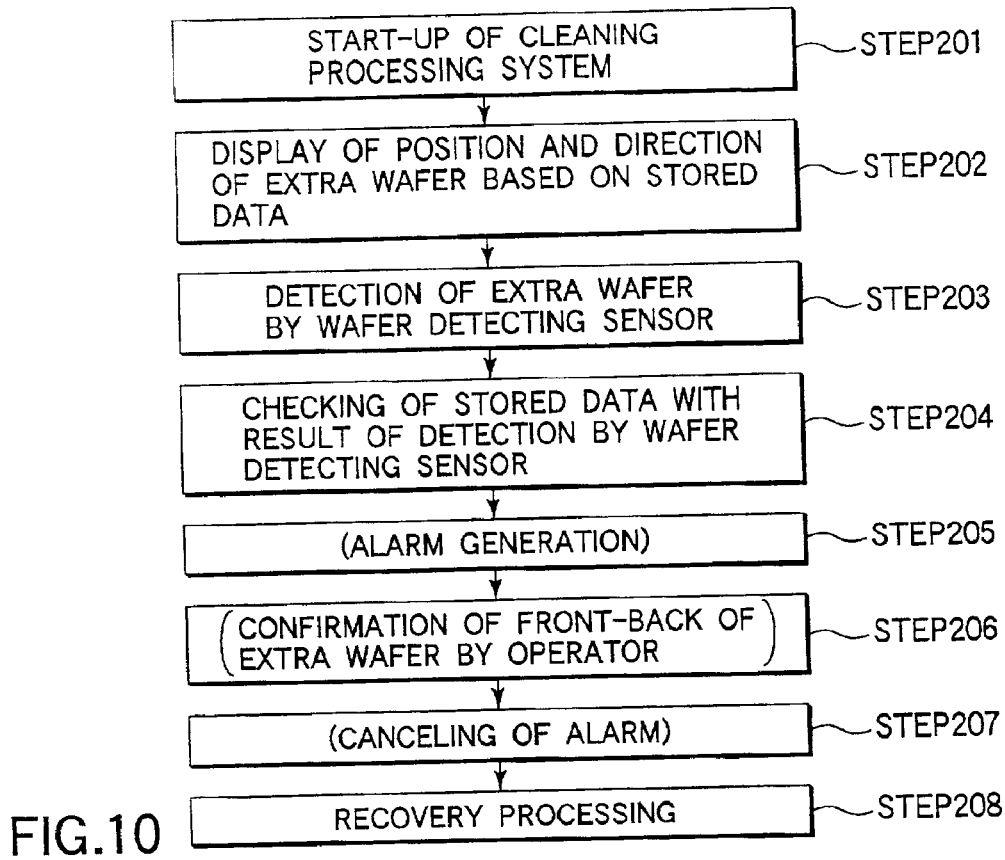

SUBSTRATE PROCESSING APPARATUS AND METHOD

BACKGROUND OF THE INVENTION

1. Field of the Invention

The present invention relates to a substrate processing apparatus and a substrate processing method for applying a prescribed processing such as a liquid processing or a thermal processing after the liquid processing to a substrate such as a semiconductor wafer or an LCD substrate.

2. Description of the Related Art

In the manufacturing process of, for example, a semiconductor device, it is necessary to maintain a high cleanliness on the surface of a semiconductor wafer on which a semiconductor device is formed. Therefore, the wafer is cleaned both before and after each of various manufacturing processes. In particular, the photolithography process, it is absolutely necessary to clean the front surface and the back surface of the wafer. Therefore, widely performed is a scrub washing for removing the contaminant substances such as particles attached to the upper surface of the wafer by allowing a rotating brush to abut against the upper surface of the wafer disposed substantially horizontal and making a planar rotation while supplying a cleaning liquid onto the upper surface of the wafer and by allowing the brush to make a reciprocating movement between the central portion and the peripheral portion of the wafer.

The transfer of the wafer into and out of the cleaning processing apparatus for performing such a scrub washing is performed by using a container capable of housing a plurality of wafers in substantially a horizontal posture a prescribed distance apart from each other in a vertical direction. In order to distinguish the front surface and the back surface of the wafer, the wafers housed in the container are aligned in a front-upward state that the front surfaces of the wafers are positioned to face upward.

In the cleaning processing apparatus of the construction described above, a wafer is taken out from a prescribed slot of the container so as to be transferred into apparatus. Then, the wafer is reversed in a prescribed timing in accordance with the recipe so as to apply a cleaning processing to the front and back surfaces of the wafer and to apply, for example, a drying treatment after the cleaning processing. These various kinds of processing are carried out while recognizing which of the front and back surfaces of the wafer constitutes the upper surface. Finally, after completion of the processing, the wafer is brought back into the original slot of the container under the state that the front surface of the wafer faces upward. In the ordinary operation, all the wafers that were housed in a container are brought back into the original slots of the container after completion of the processing, thereby finishing all the steps.

However, where the power supply of the cleaning processing apparatus is broken down during the cleaning processing by, for example, the natural calamity such as an earthquake or a strong wind, or by an artificial mistake, it is impossible to complete the processing of all the wafers housed in the container. In this case, all the wafers present in the cleaning processing apparatus must be recovered in starting up again the cleaning processing apparatus. It was customary in the past to recover the wafer in the vacant slot of the container without distinguishing the front surface and the back surface of the wafer.

However, if the wafer is housed in the container in a back-upward state so that the back surface of the wafer constitutes the upper surface, the front surface of the wafer is rubbed by a rack plate arranged within the container for holding the wafer, with the result that the wafer is scratched so as to be rendered unusable. Also, in starting again the wafer processing, it is necessary for the operator to visually confirm the state of the wafers housed in the container so as to align the wafers in the front-upward state so that the front surfaces of the wafers are positioned to face upward. In this case, a heavy burden is placed on the operator. In addition, productivity is lowered. Further, since the wafers are manually handled by the operator, it is possible for the wafer to drop from the operator's hand and break.

BRIEF SUMMARY OF THE INVENTION

A first object of the present invention is to provide a substrate processing apparatus and a substrate processing method which permit recovering the substrates remaining inside the apparatus while avoiding a damage done to the surface of the substrate.

A second object of the present invention is to provide a substrate processing apparatus and a substrate processing method which permit alleviating the burden placed on the operator.

Further, a third object of the present invention is to provide a substrate processing apparatus and a substrate processing method which permit facilitating the recovery of the substrates remaining inside the apparatus and also permit facilitating the restarting of a prescribed processing applied to the substrate.

According to a first aspect of the present invention, there is provided a substrate processing apparatus, comprising:

an apparatus body for applying a prescribed processing to a substrate, the substrate being reversed inside said apparatus body;

substrate transfer means for transferring the substrate inside said apparatus body;

substrate detecting means for detecting the substrate present inside said apparatus body;

memory means for storing information concerning the position and direction of the substrate present inside said apparatus body when the power supply of said apparatus body is cut off and for taking out the stored information when the power supply of said apparatus body is turned on again;

alarm means for checking the information detected by said substrate detecting means with the information taken out of said memory means when the power supply of said apparatus body is turned on so as to generate an alarm when the detected information and the information taken out of said memory means differ from each other;

alarm canceling means for canceling said alarm;

control means for controlling said substrate transfer means to permit the substrate present inside said apparatus body to be recovered in a prescribed position outside said apparatus body; and recovery start-up means for emitting an instruction to start the substrate recovery to said control means, wherein, after the alarm is canceled by said alarm canceling means and after it has been confirmed that the substrate present inside said apparatus body is recovered under the state that the substrate faces in a prescribed direction, said recovery start-up means emits an instruction to recover the substrate to said control means.

According to a second aspect of the present invention, there is provided a substrate processing apparatus, comprising:

an apparatus body for applying a prescribed processing to a substrate, the substrate being reversed inside said apparatus body;

substrate transfer means for transferring the substrate inside said apparatus body;

memory means for storing information concerning the position and direction of the substrate present inside said apparatus body when the power supply of said apparatus body is cut off and for taking out the stored information when the power supply of said apparatus body is turned on again;

information operating means for operating the information taken out of said memory means when the power supply of said apparatus body is turned on;

control means for controlling said substrate transfer means based on the substrate information obtained by said information operating means so as to permit the substrate to be recovered in a prescribed position outside said apparatus body; and recovery start-up means for emitting an instruction to start the substrate recovery to said control means, wherein, after it has been confirmed that the substrate present inside said apparatus body is recovered under the state that the said substrate faces in a prescribed direction, said recovery start-up means emits an instruction to recover the substrate to said control means.

According to a third aspect of the present invention, there is provided a substrate processing apparatus for applying a prescribed processing to a substrate, comprising:

a container loading/unloading section for loading and unloading a container capable of housing a plurality of substrates a prescribed distance apart from each other;

an apparatus body including a substrate processing section having a liquid processing unit for applying a prescribed liquid processing to the front surface or back surface of the substrate and a reversal unit for reversing the substrate, and a substrate transfer section for transferring the substrate between said container loading/unloading section and said substrate processing section;

a first substrate transfer device for transferring the substrate in said substrate processing section;

a second substrate transfer device for transferring the substrate in said substrate transfer section;

substrate detecting means for detecting the substrate present inside said apparatus body;

memory means for storing the information concerning the position and direction of the substrate present inside said apparatus body when the power supply of said apparatus body is cut off and taking out the stored information when the power supply of said apparatus body is turned on again;

alarm means for checking the information detected by said substrate detecting means with the information taken out of said memory means when the power supply of said apparatus body is turned on so as to generate an alarm when the detected information and the information taken out of said memory means differ from each other;

alarm canceling means for canceling said alarm;

control means for controlling said first substrate transfer device and said second substrate transfer device so as to permit the substrate present inside said apparatus body to be recovered in a container arranged in said container loading/unloading section; and recovery start-up means for emitting an instruction to start the substrate recovery to said control means, wherein, after the alarm is canceled by said alarm canceling means and after it has been confirmed that the substrate inside said apparatus body is recovered under the state that the substrate faces in a prescribed direction, said recovery start-up means emits an instruction to start the substrate recovery to said control means.

According to a fourth aspect of the present invention, there is provided a substrate processing apparatus for applying a prescribed processing to a substrate, comprising:

a container loading/unloading section for loading and unloading a container capable of housing a plurality of substrates a prescribed distance apart from each other;

an apparatus body including a substrate processing section having a liquid processing unit for applying a prescribed liquid processing to the front surface or back surface of the substrate and a reversal unit for reversing the substrate, and a substrate transfer section for transferring the substrate between said container loading/unloading section and said substrate processing section;

a first substrate transfer device for transferring the substrate in said substrate processing section;

a second substrate transfer device for transferring the substrate in said substrate transfer section;

memory means for storing the information concerning the position and direction of the substrate present inside said apparatus body when the power supply of said apparatus body is cut off and for taking out the stored information when the power supply of said apparatus body is turned on again;

information operating means for operating the information taken out of said memory means when the power supply of said apparatus body is turned on;

control means for controlling said first substrate transfer device and said second substrate transfer device so as to permit the substrate present inside said substrate body to be recovered in a container arranged in said container loading/unloading section on the basis of the substrate information obtained by said information operating means; and recovery start-up means for emitting an instruction to start the substrate recovery to said control means, wherein, after it has been confirmed that the substrate present inside said apparatus body is recovered under the state that the substrate faces in a prescribed direction, said recovery start-up means emits an instruction on the substrate recovery to said control means.

According to a fifth aspect of the present invention, there is provided a substrate processing method in a substrate processing apparatus for applying a prescribed processing to the front surface and the back surface of a substrate, said substrate processing apparatus being provided with substrate transfer means for transferring the substrate therein, comprising the steps of:

storing information concerning the position and direction of the substrate present inside said substrate processing apparatus in a memory when the power supply of said substrate processing apparatus is cut off;

taking out the information stored in the memory when the power supply of said substrate processing apparatus is turned on first after said storing step;

correcting the information taken out in said step of taking out the stored information to coincide with the actual substrate state inside said substrate processing apparatus, and determining a substrate information; and allowing said substrate transfer means to transfer the substrate present inside said substrate processing apparatus under the state that the substrate faces in a prescribed direction to a prescribed position outside said substrate processing apparatus based on the substrate information determined in said determining step.

According to a sixth aspect of the present invention, there is provided a substrate processing method in a substrate processing apparatus for applying a prescribed processing to the front surface and the back surface of a substrate, said substrate processing apparatus being provided with substrate transfer means for transferring the substrate therein, comprising the steps of:

storing information concerning the position and direction of the substrate present inside said substrate processing apparatus in a memory when the power supply of said substrate processing apparatus is cut off;

taking out the information stored in the memory when the power supply of said substrate processing apparatus is turned on first after said storing step, and detecting the substrate present inside said substrate processing apparatus; and checking the information taken out of the memory in said detecting step with a position information of the substrate detected within said substrate processing apparatus so as to determine a substrate information when the information taken out of said memory coincides with said position information of the substrate, and allowing said substrate transfer means to transfer the substrate present inside said substrate processing apparatus under the state that the substrate faces in a prescribed direction to a prescribed position outside said substrate processing apparatus based on said substrate information.

According to a seventh aspect of the present invention, there is provided a substrate processing method in a substrate processing apparatus for applying a prescribed processing to the front surface and the back surface of a substrate, said substrate processing apparatus being provided with substrate transfer means for transferring the substrate therein, comprising the steps of:

storing information concerning the position and direction of the substrate present inside said substrate processing apparatus in a memory when the power supply of said substrate processing apparatus is cut off;

taking out the information stored in the memory when the power supply of said substrate processing apparatus is turned on first after said storing step, and detecting the substrate present inside said substrate processing apparatus;

checking the information taken out of the memory with a position information of the substrate detected within said substrate processing apparatus, and emitting an alarm when there is a difference between the information taken out of the memory and said position information differ or there is an unclear point in the information;

allowing an operator to determine a substrate information denoting the actual state of the substrate inside said substrate processing apparatus so as to cancel said alarm; and allowing said substrate transfer means to transfer the substrate present inside said substrate processing apparatus under the state that the substrate faces in a prescribed direction to a prescribed position outside said substrate processing apparatus based on the substrate information determined in said alarm canceling step.

According to an eighth aspect of the present invention, there is provided a substrate processing apparatus, comprising:

an apparatus body for applying a prescribed processing to a substrate, the substrate being reversed within said substrate body;

substrate transfer means for transferring the substrate within said apparatus body;

substrate detecting means for detecting the substrate present inside said apparatus body;

control means for determining the operation of said substrate transfer means to recover the substrate in a prescribed position outside said apparatus body in the case where said substrate detecting means has detected the substrate within said apparatus body when the power supply of said apparatus body is turned on; and recovery start-up means for emitting an instruction to start the recovery of the substrate present inside said apparatus body to said control means, wherein, after it has been confirmed that the substrate present inside said apparatus body is recovered under the state that the substrate faces in a prescribed direction, said recovery start-up means emits an instruction to recover the substrate to said control means.

Further, according to a ninth aspect of the present invention, there is provided a substrate processing apparatus for applying a prescribed processing to a substrate, comprising:

a container loading/unloading section for loading and unloading a container capable of housing a plurality of substrates a prescribed distance apart from each other;

an apparatus body including a substrate processing section having a liquid processing unit for applying a prescribed liquid processing to the front surface or back surface of a substrate and a reversal unit for reversing the substrate to permit the front surface or the back surface of the substrate to face upward, and a substrate transfer section for transferring the substrate between said container loading/unloading section and said substrate processing section;

a first substrate transfer device for transferring the substrate within said substrate processing section;

a second substrate transfer device for transferring the substrate within said substrate transfer section;

substrate detecting means for detecting the substrate present inside said apparatus body;

control means for determining the operation of said first substrate transfer device and said second substrate transfer device to recover the substrate in a container disposed within said container loading/unloading section in the case where said substrate detecting means has detected the substrate within said apparatus body when the power supply of said apparatus body is turned on; and recovery handling means for emitting an instruction to start the recovery of the substrate present inside said apparatus body to said control means, wherein, after it has been confirmed that the substrate present inside said substrate processing section is recovered under the state that the substrate faces in a prescribed direction, said recovery start-up means emits an instruction to recover the substrate to said control means.

According to the substrate processing apparatus and the substrate processing apparatus of the present invention constructed as described above, it is possible to grasp easily the position and direction of the substrate, i.e., whether the front surface of the wafer faces upward or downward, present inside the substrate processing apparatus when the substrate processing apparatus is started up first after the power supply of the substrate processing apparatus is cut off. As a result, it is possible to recover easily the substrates having the directions thereof aligned, if an operator distinguishes the front surface and the back surface of the substrate as required and performs the operation in accordance with a prescribed processing procedure. It is also possible to perform an automatic recovery. It follows that the substrate can be prevented from being damaged, and the burden of the operator can be lowered. It is also possible to prevent the substrate from being dropped from the operator's hand when the operator directly handles the substrate.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detail description of the preferred embodiments given below, serve to explain the principles of the invention.

FIGS. 8A, 8B, 8C and 8D are drawings showing changes in the display on a monitor during the data compilation;

FIG. 10 is a flow chart showing as another example the recovery mode of the extra wafer at the start-up time of the cleaning processing system;

FIG. 11 is a drawing schematically showing as another example the contents displayed on a monitor at the start-up time of the cleaning processing system.

DETAILED DESCRIPTION OF THE INVENTION

Some embodiments of the substrate processing apparatus of the present invention will now be described with reference to the accompanying drawings. The embodiments described in the following are directed to the cases where the technical idea of the present invention is applied to the cleaning processing system constructed such that the transfer, washing and drying of a semiconductor wafer (wafer) are carried out consistently.

Figure 1:
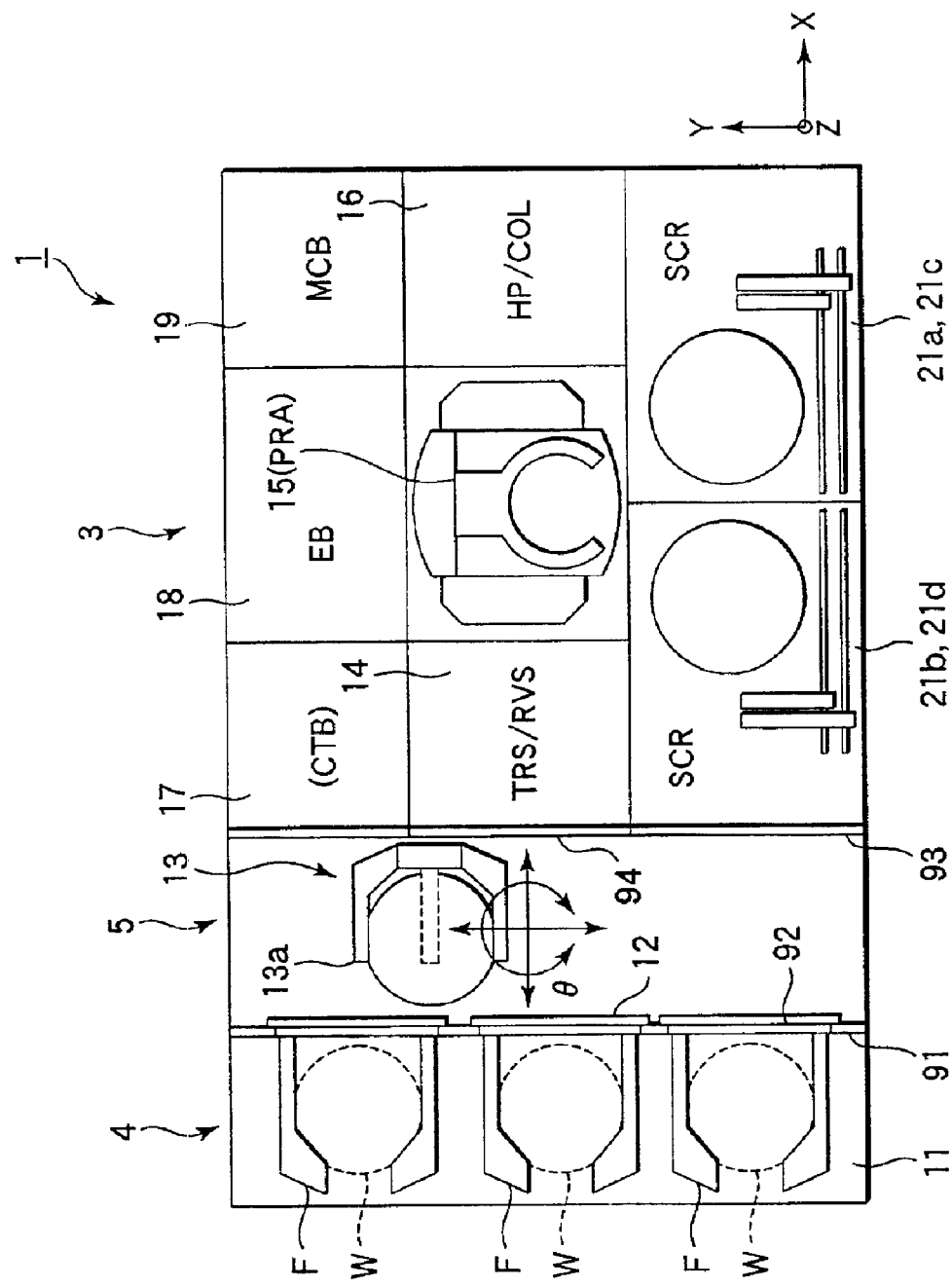
FIG. 1 is a plan view schematically showing the construction of a cleaning processing system.
Figure 2:
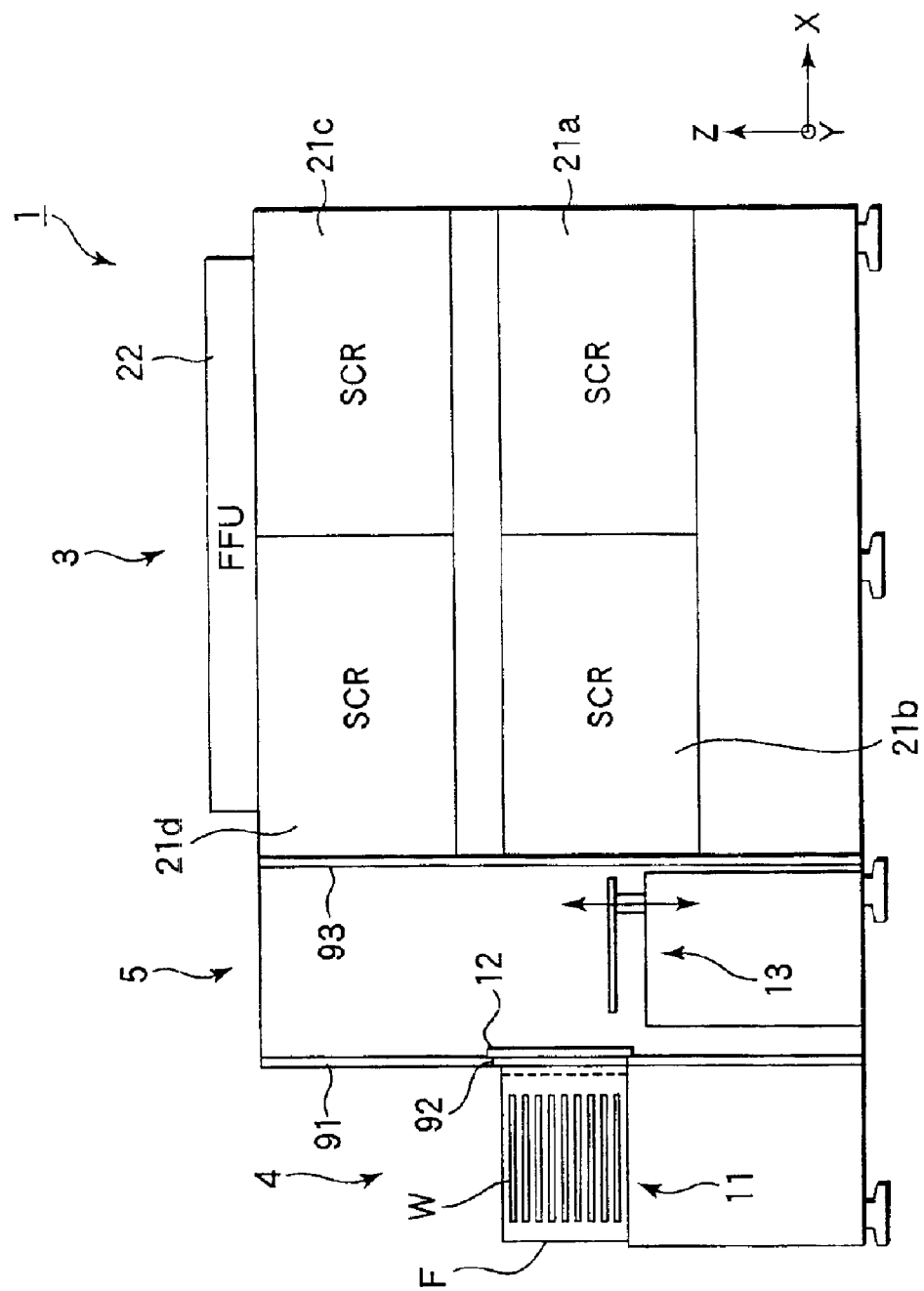
FIG. 2 is a side view showing the cleaning processing system shown in FIG. 1.

FIG. 1 is a plan view schematically showing the construction of a cleaning processing system 1, and FIG. 2 is side view of the cleaning processing system shown in FIG. 1. As shown in FIGS. 1 and 2, the cleaning processing system 1 comprises a substrate cleaning processing section 3, an in-out port 4, and a wafer transfer section 5. The substrate cleaning processing section 3 is the section for applying a cleaning processing and thermal treatment after the cleaning processing to a wafer W. The in-out port 4 is the section in which is arranged a table 11 for disposing a container, i.e., a FOUP F (FOUP: Front Opening Unified Pod), capable of housing a plurality of wafers, e.g., 25 wafers, in substantially a horizontal posture a prescribed distance apart from each other in a vertical direction. The transfer section 5 is the section provided with a wafer transfer device (CRA) 13 for transferring the wafer W between the FOUP F disposed on the table 11 and the substrate cleaning processing section 3. The apparatus body of the cleaning processing system 1 comprises the substrate cleaning processing section 3 and the wafer transfer section 5.

Transfer of the wafer W into and out of the FOUP F is carried out through a transfer port formed in one side wall of the FOUP F. A lid for opening and closing the transfer port is mounted to the FOUP F. Also, a rack plate for holding a plurality of wafers W a prescribed distance apart from each other in the vertical direction is mounted to the inner wall of the FOUP F thereby forming twenty-five slots of slot 1 to slot 25 for housing the wafers W. The wafer W is housed in each slot under the state that the front surface of the wafer W, on which a semiconductor device is to be formed, constitutes the upper surface when the wafer W is held horizontal.

It is possible to dispose, for example, three FOUPs F on the table 11 arranged in the in-out port 4 such that the three FOUPs F are aligned in a Y-direction on a horizontal plane. The FOUP F is disposed such that the side wall in which is formed the transfer port is positioned to face a boundary wall 91 between the in-out port 4 and the wafer transfer section 5. A window section 92 is formed in that position of the boundary wall 91 which corresponds to the position where the FOUP F is disposed. A window section opening/closing mechanism 12 for opening and closing the window section 92 by, for example, a shutter is arranged on the side of the wafer transfer section 5 relative to each window section 92.

The window section opening/closing mechanism 12 is also capable of holding the lid of the FOUP F, with the result that the transfer port of the FOUP F can also be opened and closed simultaneously with the opening and closing of the window section 92. It is desirable to mount an interlock to the window section opening/closing mechanism 12 so as to prevent the window section opening/closing mechanism 12 from being operated when the FOUP F is not disposed in a prescribed position on the table 11. If the window section 92 is opened so as to permit the wafer transfer port of the FOUP F to communicate with the wafer transfer section 5, it is possible for the wafer transfer device (CRA) 13 arranged in the wafer transfer section 5 to gain access to the FOUP F. As a result, transfer of the wafer W is rendered possible.

A wafer detecting device (not shown) is arranged in an upper portion of each window section 92 for detecting the number and states of wafers W housed in the FOUP F for every slot. It is possible for the particular wafer detecting device to be mounted to the window section opening/closing mechanism 12.

The wafer transfer device (CRA) 13 arranged within the wafer transfer section 5 is movable in both the Y-direction and a Z-direction and is swingable on an X-Y plane, i.e., swingable in the θ direction. The wafer transfer device (CRA) 13 has a transfer pick a for holding the wafer W. The transfer pick 13a is slidable in the X-direction. As a result, the transfer pick 13a is capable of gaining access to the slot of an optional height of every FOUP F disposed on the table 11 and is also capable of gaining access to two wafer transfer units (TRS) 14a and 14b (shown in FIG. 3) arranged in the substrate cleaning processing section 3.

A wafer detecting sensor (not shown) for detecting whether or not the wafer W is held by the transfer pick 13a is mounted to the wafer transfer device (CRA) 13. The wafer detecting sensor also functions as a position sensor that makes it possible to transfer the wafer W out of a prescribed slot of the FOUP F and to transfer the wafer W back into the prescribed slot. In other words, the wafer detecting sensor also permits recognizing the slot of the FOUP F.

The substrate cleaning processing section 3 comprises a transfer/reversal section (TRS/RVS) 14 including two wafer reversal units (RVS) 14c, 14d (shown in FIG. 3) for reversing the surfaces of the wafer W and two wafer transfer units (TRS) 14a, 14b (shown in FIG. 3) for temporarily disposing the wafer W for performing the wafer transfer to and from the wafer transfer section 5. The substrate cleaning processing section 3 also comprises a heating/cooling section (HP/COL) 16 including three hot plate units (HP) 16a to 16c (shown in FIG. 3) for heating the wafer W after the cleaning processing and a cooling unit (COL) 16d (shown in FIG. 3) for cooling the heated wafer W.

Further, the substrate cleaning processing section 3 comprises four scrub washing units (SCR) 21a to 21d for applying a scrub washing to the wafer W and a main wafer transfer device (PRA) 15 capable of gaining access to all the units arranged in the substrate cleaning processing section 3 and serving to transfer the wafer W among these units.

A wafer detecting sensor (not shown) for detecting whether or not the wafer W is present in each unit is arranged in each of the wafer transfer units (TRS) 14a, 14b, the wafer reversal units (RVS) 14c, 14d, and the scrub washing units (SCR) 21a to 21d. Incidentally, it is also possible naturally to arrange the wafer detecting sensor in each of the hot plate units (HP) 16a to 16c and the cooling unit (COL) 16d.

Arranged in the substrate cleaning processing section 3 are an electrical apparatus unit (EB) 18 providing a power supply for operating the entire cleaning processing system 1, a mechanical control unit (MCB) 19 for operating and controlling the various units arranged in the cleaning processing system 1 and the entire cleaning processing section 1, and a chemical liquid storage unit (CTB) 17 for storing a prescribed cleaning liquid that is to be supplied to the scrub washing units (SCR) 21a to 21d. The electrical apparatus unit (EB) 18 is connected to a main power supply (not shown). Arranged in the ceiling portion of the substrate cleaning processing section 3 is a filter fan unit (FFU) 22 for supplying a clean air as a down flow stream into each unit handling the wafer W and into the main wafer transfer device (PRA) 15.

It is possible to apply a maintenance operation to the transfer/reversal section (TRS/RVS) 14, the main wafer transfer device (PRA) 15 and the heating/cooling section (HP/COL) 16 from the side surfaces in the Y-direction by arranging the chemical liquid storage unit (CTB) 17, the electric apparatus unit (EB) 18 and the mechanical control unit (MCB) 19 in the outside portion of the substrate cleaning processing section 3 or by withdrawing these units 17, 18 and 19 to the outside.

Figure 3:
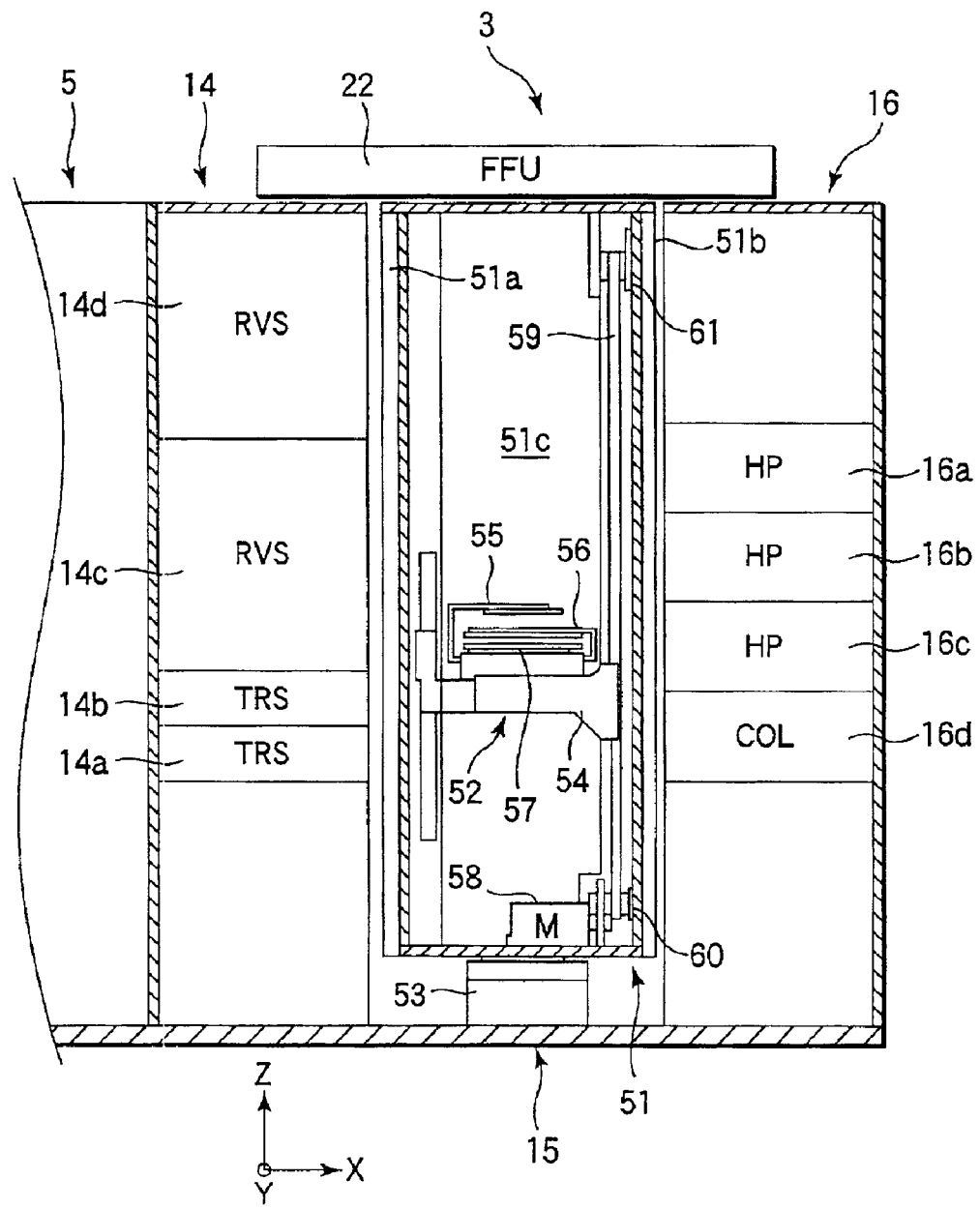
FIG. 3 is a cross sectional view showing the arrangement of a delivery/reversal section, a main wafer transfer device, and a heating/cooling unit.

FIG. 3 is a cross sectional view showing the arrangement of the wafer transfer units (TRS) 14a, 14b, and the wafer reversal units (RVS) 14c, 14d included in the transfer/reversal section (TRS/RVS) 14 together with the arrangement of the main wafer transfer device (PRA) 15 positioned adjacent to the transfer/reversal section (TRS/RVS) 14 in the X-direction and the heating/cooling section (HP/COL) 16. As shown in the drawing, the wafer transfer units (TRS) 14a and 14b are stacked one upon the other in a lower portion of the transfer/reversal section (TRS/RVS) 14, and the wafer reversal units (RVS) 14c and 14d are further stacked one upon the other on the wafer transfer unit (TRS) 14b.

For example, the lower stage wafer transfer unit (TRS) 14a can be used for disposing the wafer W that is to be transferred from the side of the in-out port 4 toward the substrate cleaning processing section 3. On the other hand, the upper stage wafer transfer unit (TRS) 14b can be used for disposing the wafer W that is to be transferred from the side of the substrate cleaning processing section 3 toward the in-out port 4.

The lower stage wafer reversal unit (RVS) 14c can be used for reversing the wafer W from the state that the front surface of the wafer W on which a semiconductor device is to be formed faces upward to the state that the front surface of the wafer W faces downward. On the other hand, the upper stage wafer reversal unit (RVS) 14d can be used for reversing the wafer W from the state that the front surface of the wafer W faces downward to the state that the front surface faces upward.

The clean air blown from the filter fan unit (FFU) 22 to form a down flow stream is introduced partly into the wafer transfer units (TRS) 14a, 14b and into the wafer reversal units (RVS) 14c, 14d and, then, flows out toward the wafer transfer section 5. As a result, it is possible to prevent the particles or the like from being introduced from the wafer transfer section 5 into the substrate cleaning processing section 3 so as to maintain a high cleanliness within the substrate cleaning processing section 3.

The main wafer transfer device (PRA) 15 comprises vertical walls 51a, 51b, a cylindrical support member 51 having a side surface open portion 51c formed between these vertical walls 51a and 51b and extending in the Z-direction, and a wafer transfer member 52 arranged movable inside the cylindrical support member 51 in the Z-direction along the cylindrical support member 51. The cylindrical support member 51 can be rotated by a motor 53, and the wafer transfer member 52 is also rotated in accordance with rotation of the cylindrical support member 51.

The wafer transfer member 52 includes a transfer base 54 and three main wafer transfer arms 55, 56 and 57 movable back and forth along the transfer base 54. The main wafer transfer arms 55 to 57 are sized to be capable of passing within the side surface open portion 51c of the cylindrical support member 51. Also, these main wafer transfer arms 55 to 57 can be moved back and forth independently by a motor and a belt mechanism housed within the transfer base 54. The wafer transfer member 52 can be moved vertically, if a belt 59 is driven by a motor 58. Incidentally, a reference numeral 60 shown in FIG. 3 denotes a driving pulley, and a reference numeral 61 denotes a driven pulley. It should also be noted that a wafer detecting sensor (not shown) for detecting whether or not the wafer W is held is mounted to the main wafer transfer device (PRA) 15.

The heating/cooling section (HP/COL) 16 is arranged on the opposite side of the transfer/reversal section (TRS/RVS) 14 with the main wafer transfer device (PRA) 15 interposed therebetween. In the heating/cooling section (HP/COL) 16, three hot plate units (HP) 16a to 16c for forcedly heating and naturally cooling the wafer W are stacked one upon the other on a single cooling unit (COL) 16d for forcedly cooling the wafer W.

As shown in FIG. 2, two scrub washing units (SCR) 21a and 21b are arranged side by side to form a lower stage, and additional two scrub washing units (SRC) 21c and 21d are stacked on the scrub washing units (SCR) 21a and 21b, respectively, to form an upper stage. For example, the scrub washing units (SCR) 21c and 21d arranged on the upper stage are used for washing the front surface of the wafer W, and the scrub washing units (SCR) 21a and 21b arranged on the lower stage are used for washing the back surface of the wafer W. In this case, a spin chuck for holding the wafer W substantially horizontal and for rotating the held wafer W, which is constructed to hold the wafer W by utilizing the vacuum suction force, is used suitably in each of the scrub washing units (SRC) 21c and 21d for washing the front surface of the wafer W. On the other hand, a spin chuck that mechanically holds the outer periphery of the wafer W for holding the wafer W is used suitably in each of the scrub washing units (SRC) 21a and 21b for washing the back surface of the wafer W.

One mode of the cleaning processing step of the wafer W using the cleaning processing system 1 described above will now be described. This mode covers the case where the wafer transfer unit (TRS) 14a is used for disposing the wafer W transferred from the side of the in-out port 4 toward the substrate cleaning processing section 3, and the wafer transfer unit (TRS) 14b is used for disposing the wafer W transferred from the side of the substrate cleaning processing section 3 toward the in-out port 4. Also, the wafer reversal unit (RVS) 14c is used for reversing the wafer W from the state that the front surface of the wafer W faces upward to the state that the front surface of the wafer W faces downward. On the other hand, the wafer reversal unit (RVS) 14d is used for reversing the wafer W from the state that the front surface of the wafer W faces downward to the state that the front surface of the wafer W faces upward. Further, the scrub washing units (SCR) 21c and 21d are used for washing the front surface of the wafer W, and the scrub washing units (SCR) 21a and 21b are used for washing the back surface of the wafer W.

Figure 4:
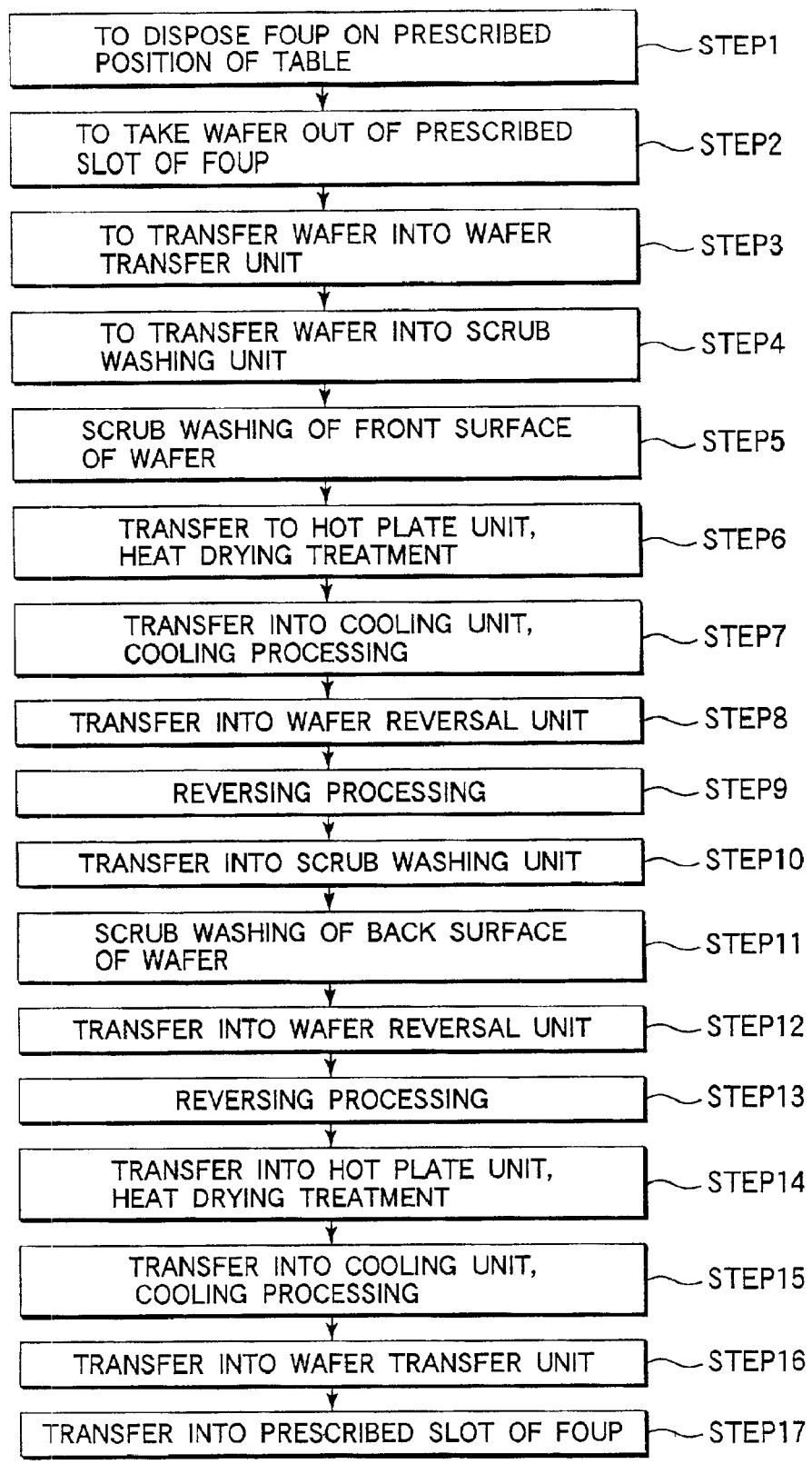
FIG. 4 is a flow chart briefly showing the cleaning processing step.

FIG. 4 is a flow chart briefly showing the cleaning processing step described in the following. In the first step, the FOUP F housing 25 wafers W under the state that the front surface faces upward is disposed on the table 11 (step 1). Then, the window section 92 and the transfer port of the FOUP F are opened by the window section opening/closing mechanism 12, followed by taking the wafer W in a prescribed slot of the FOUP F out of the FOUP F by using the wafer transfer device (CRA) 13 (step 2). Further, the wafer W thus taken out is transferred to the wafer transfer unit (TRS) 14a (step 3).

The main wafer transfer device (PRA) 15 takes the wafer W out of the wafer transfer unit (TRS) 14a and transfers the wafer W thus taken out to any of the scrub washing units (SCR) 21c and 21d for washing the front surface of the wafer W (step 4) so as to subject the wafer W to the scrub washing (step 5).

The wafer W after completion of the processing in step 5 is transferred to any of the hot plate units (HP) 16a to 16c by the main wafer transfer device (PRA) 15 so as to be subjected to a heat drying treatment (step 6) and, then, further transferred to the cooling unit (COL) 16d so as to be cooled (step 7).

The cooled wafer W is transferred to the wafer reversal unit (RVS) 14c by the main wafer transfer device (PRA) 15 (step 8). In the wafer reversal unit (RVS) 14c, the wafer W is reversed by 180° from the state that the front surface of the wafer W faces upward to the state that the front surface of the wafer W faces downward (step 9). The wafer W reversed by the process in step 9 is transferred to any of the scrub washing units (SCR) 21a and 21b by the main wafer transfer device (PRA) 15 (step 10) and, then, a scrub washing is applied to the back surface of the wafer W (step 11).

The wafer W after completion of the process in step 11 is transferred to the wafer reversal unit (RVS) 14d by the main wafer transfer device (PRA) 15 (step 12) and, then, the wafer W is reversed such that the front surface of the wafer W is allowed to face upward (step 13). The wafer W whose front surface was allowed to face upward in step 13 is transferred by the main wafer transfer device (PRA) 15 from the wafer reversal unit (RVS) 14d to any of the hot plate units (HP) 16a to 16c so as to be subjected to a heat drying treatment (step 14). Then, the wafer W is transferred by the main wafer transfer device (PRA) 15 to the cooling unit (COL) 16d so as to be cooled (step 15).

The cooled wafer W is transferred by the main wafer transfer device (PRA) 15 from the cooling unit (COL) 16d to the wafer transfer unit (TRS) 14b (step 16). The wafer W after completion of the cleaning processing on the wafer transfer unit (TRS) 14b is brought back to the prescribed slot within the FOUP F by the wafer transfer device (CRA) 13 (step 17). Incidentally, it is possible to omit the processes in steps 6 and 7 and the processes in steps 14 and 15.

In order to carry out the cleaning processing by the processes in steps 1 to 17 described above, it is necessary to carry out an initializing processing when the power supply of the cleaning processing system 1 is turned on so as to start up the operation of the cleaning processing system 1. The initializing processing noted above includes the confirmation of the operation for looking into the state of the cleaning processing system 1 as to whether each of the units constituting the cleaning processing system 1 is in condition for performing a normal operation, and the confirming operation as to whether or not the wafer W is present in each unit or the transfer device.

Where the wafer W has been found to be present in the cleaning processing system 1 (the wafer W in this case being called herein later an extra wafer), it is necessary to carry out a recovery processing for bringing the extra wafer back into the FOUP F disposed on the table 11 because the extra wafer obstructs the start-up of the cleaning processing.

The extra wafer is caused to be present within the cleaning processing system 1 in, for example, the case where the power supply within the cleaning processing system 1 is unavoidably cut off during operation of the cleaning processing system 1 by the power failure due to the natural calamity such as an earthquake or a typhoon, and in the case where the power supply within the cleaning processing system 1 is intentionally cut off for ensuring the safety of the operator when a trouble takes place in the substrate cleaning processing section 3.

Incidentally, it is necessary to carry out the initializing processing when the cleaning processing system 1 is started up again in the case where the power supply is cut off for stopping the operation of the cleaning processing system 1 after completion of the normal cleaning processing. It is necessary to confirm the presence or absence of the extra wafer in this case, too, in order to ensure the safety of the operation of the cleaning processing system 1.

If, for example, the extra wafer is brought back into the FOUP F under the state that the front surface of the extra wafer faces downward in the recovery processing of the extra wafer, it is possible for the front surface of the extra wafer to be scratched when the extra wafer is held by the transfer pick 13a. It is also possible for the front surface of the extra wafer to be rubbed with the rack plate arranged within the FOUP F, with the result that the extra wafer is scratched. In this case, it is highly possible for the extra wafer not to be used as a product. For avoiding these problems, it is desirable for the extra wafer to be brought back into the FOUP F under the state that the front surface of the extra wafer faces upward during the recovery processing of the extra wafer.

Where the extra wafer is present within the cleaning processing system 1, the extra wafer is recovered from each unit included in the cleaning processing system 1 when the power supply of the cleaning processing system 1 is turned on so as to start up the operation of the cleaning processing system 1. The order of units from which the extra wafer is recovered is as a rule (1) the wafer transfer device (CRA) 13, (2) the wafer transfer units (TRS) 14a, 14b, (3) the main wafer transfer device (PRA) 15, (4) the wafer reversal units (RVS) 14c, 14d, (5) the scrub washing units (SCR) 21a to 21d, (6) the hot plate units (HP) 16a to 16c, and (7) the cooling unit (COL) 16d.

The wafer transfer device (CRA) 13 does not perform the function of reversing the wafer W, and the wafer W is transferred under a substantially horizontal state between the FOUP F and the wafer transfer devices (TRS) 14a, 14b. Therefore, the wafer W is absolutely transferred by the transfer pick 13a of the wafer transfer device (CRA) 13 under the state that the front surface of the wafer W faces upward. It follows that, where the transfer pick 13a holds the extra wafer, the extra wafer is transferred as it is into a vacant slot of the FOUP F.

The front surface of the extra wafer faces upward in also the case where the extra wafers are present within the wafer transfer units (TRS) 14a, 14b. Therefore, these extra wafers are transferred by the wafer transfer device (CRA) 13 from within the wafer transfer units (TRS) 14a, 14b into the vacant slots of the FOUP F.

Thus, first, the extra wafers within the wafer transfer units (TRS) 14a, 14b are recovered into the FOUP F and no extra wafer is present in the transfer units (TRS) 14a, 14b. Therefore, it is possible to transfer temporarily the extra wafers into the wafer transfer units (TRS) 14a, 14b in the case where many extra wafers are present within the substrate cleaning processing section 3.

Where extra wafers are held by the main wafer transfer device (PRA) 15, there are two cases, i.e., case (a-1) where the front surface of the extra wafer faces upward, and case (a-2) where the front surface of the extra wafer faces downward. In case (a-1), the main wafer transfer device (PRA) 15 transfers the extra wafer held by the main wafer transfer device (PRA) 15 into any of the wafer transfer units (TRS) 14a and 14b, and the wafer transfer device (CRA) 13 transfers the extra wafer from within the wafer transfer unit (TRS) 14a or 14b into the prescribed slot of the FOUP F.

On the other hand, in case (a-2), the extra wafer held by the main wafer transfer device (PRA) 15 is transferred into any of the wafer reversal units (RVS) 14c, 14d so as to have the extra wafer reversed such that the front surface of the extra wafer faces upward. Then, the main wafer transfer device (PRA) 15 transfers the extra wafer from within the wafer reversal unit (RVS) 14c or 14d into any of the wafer transfer units (TRS) 14a, 14b. Further, the wafer transfer device (CRA) 13 transfers the extra wafer from within the wafer transfer unit (TRS) 14a or 14b into the prescribed slot of the FOUP F.

Where the extra wafer is present within the wafer reversal units (RVS) 14c, 14d, it is possible for the front surface of the wafer W before and after the reversing processing to face upward or downward even in the case where the unit for reversing the wafer W from the state that the front surface of the wafer W faces upward to the state that the front surface of the wafer W faces downward and the unit for reversing the wafer W in the opposite fashion are used selectively. Also, where the operation of the cleaning processing system 1 is stopped during the wafer reversing processing, it is unknown whether the front surface of the extra wafer faces upward or downward.

In other words, involved in the wafer reversal units (RVS) 14c, 14d are case (b-1) where the front surface of the extra wafer faces upward, case (b-2) where the front surface of the extra wafer faces downward, and case (b-3) where it is unknown whether the front surface of the extra wafer faces upward or downward.

In case (b-1) given above, the main wafer transfer device (PRA) 15 transfers the extra wafer from within the wafer reversal units (RVS) 14c, 14d into any of the wafer transfer units (TRS) 14a and 14b. Then, the wafer transfer device (CRA) 13 transfers the extra wafer from within the wafer transfer unit (TRS) 14a or 14b into the prescribed slot of the FOUP F.

In case (b-2), the extra wafer is instantly reversed so as to permit the front surface of the extra wafer to face upward. Then, the main wafer transfer device (PRA) transfers the extra wafer from within the wafer reversal units (RVS) 14c, 14d into any of the wafer transfer units (TRS) 14a and 14b. Further, the wafer transfer device (CRA) 13 transfers the extra wafer from within the wafer transfer unit (TRS) 14a or 14b into the prescribed slot of the FOUP F.

Further, in case (b-3), the main wafer transfer device (PRA) 15 once transfers the extra wafer present within the wafer reversal units (RVS) 14c, 14d into any of the scrub washing units (SCR) 21a and 21b for washing the back surface of the wafer. Then, the operator visually observes the disposed state of the extra wafer so as to judge the direction of the extra wafer, i.e., to judge whether the front surface of the extra wafer faces upward or downward.

Where the operator has judged as a result of the visual observation that the front surface of the extra wafer faces upward, the extra wafer is transferred by the main wafer transfer device (PRA) 15 into any of the wafer transfer units (TRS) 14a and 14b. On the other hand, where it has been judged that the front surface of the extra wafer faces downward, the extra wafer is transferred by the main wafer transfer device (PRA) 15 into any of the wafer reversal units (RVS) 14c and 14d as to be reversed. Then, the extra wafer is transferred by the main wafer transfer device (PRA) 15 into any of the wafer transfer units (TRS) 14a and 14b. The extra wafer transferred into any of the wafer transfer units (TRS) 14a and 14b is further transferred by the wafer transfer device (CRA) 13 into the prescribed slot of the FOUP F.

The scrub washing units (SCR) 21c, 21d are used for washing the front surface of wafer. Therefore, where the extra wafer is present in the scrub washing units (SCR) 21c, 21d, the front surface of the extra wafer faces upward without fail. It follows that the extra wafer present within the scrub washing units (SCR) 21c, 21d is transferred by the main wafer transfer device (PRA) 15 into any of the wafer transfer units (TRS) 14a and 14b and, then, further transferred by the wafer transfer device (CRA) 13 from within the wafer transfer unit (TRS) 14a or 14b into the prescribed slot of the FOUP F.

The scrub washing units (SCR) 21a, 21b are used for washing the back surface of the wafer. Therefore, where the extra wafer is present in the scrub washing units (SCR) 21a, 21b, the front surface of the extra wafer faces downward without fail. It follows that the extra wafer present in the scrub washing units (SCR) 21a, 21b is transferred by the main wafer transfer device (PRA) 15 into any of the wafer reversal units (RVS) 14c and 14d so as to be reversed and, then, further transferred by the main wafer transfer device (PRA) 15 into any of the wafer transfer units (TRS) 14a and 14b. Finally, the extra wafer is transferred by the wafer transfer device (CRA) 13 into the prescribed slot of the FOUP F.

Where the scrub washing units (SCR) 21a to 21d are not classified into those for washing the front surface of the wafer and those for washing the back surface of the wafer, the operation to recover the extra wafer is performed depending on the state as to whether the front surface of the extra wafer faces upward or downward. Where the front surface of the extra wafer faces upward, the extra wafer is recovered in accordance with the procedure for the case where the extra wafer is present in the scrub washing units (SCR) 21c, 21d described previously. On the other hand, where the front surface of the extra wafer faces downward, the extra wafer is recovered in accordance with the procedure for the case where the extra wafer is present in the scrub washing units (SCR) 21a, 21b described previously. Incidentally, where it is unknown whether the front surface of the extra wafer faces upward or downward, the operator visually confirms first whether the front surface of the extra wafer faces upward or downward. Then, the operator determines the suitable recovery method based on the result of the confirmation so as to recover the extra wafer.

Where the extra wafers are present in the hot plate units (HP) 16a to 16c and the cooling unit (COL) 16d, the front surfaces of the extra wafers are allowed to face upward according to the cleaning processing step described previously with reference to FIG. 4. Therefore, where the extra wafers are present in the hot plate units (HP) 16a to 16c and the cooling unit (COL) 16d, the extra wafers are recovered in accordance with the case where the extra wafers are present in the scrub washing units (SCR) 21c, 21d for washing the front surfaces of the wafer.

Incidentally, it is possible to interchange the hot plate units (HP) 16a to 16c and the cooling unit (COL) 16d in respect of the order of the extra wafer recovery. To be more specific, it is possible to recover the extra wafer first from the cooling unit (COL) 16d, followed by transferring the extra wafers present in the hot plate units (HP) 16a to 16c into the vacant cooling unit (COL) 16d for cooling the extra wafers and subsequently recovering the extra wafers into the FOUP F. In this case, it is possible to suppress the thermal effect given to the other wafers housed in the FOUP F into which the extra wafers are recovered.

Figure 5:
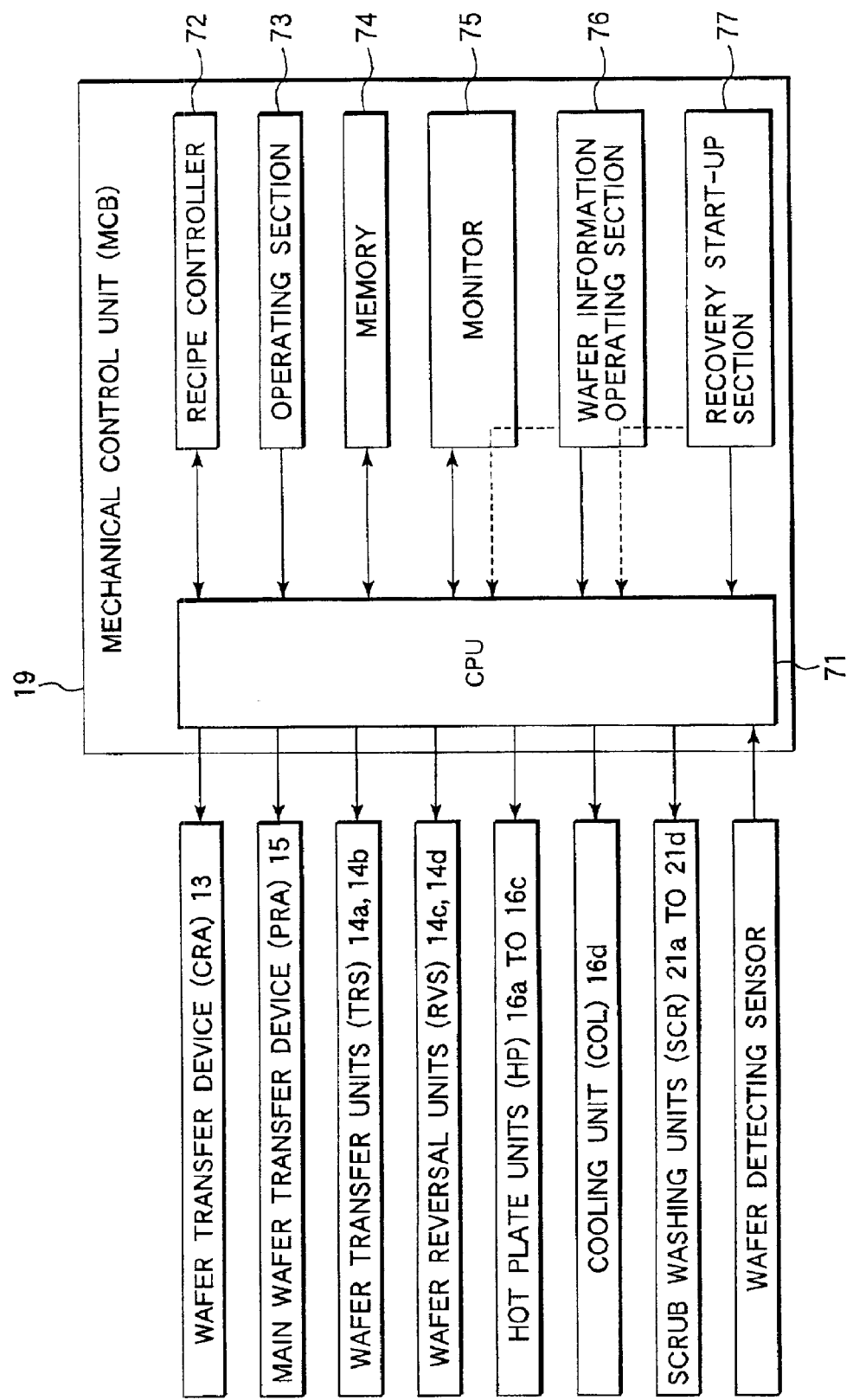
FIG. 5 is a drawing showing as an example the construction of a mechanical control unit (MCB) included in the cleaning processing system shown in FIG. 1.

FIG. 5 exemplifies the construction of the mechanical control unit (MCB) 19 for controlling the various units and the transfer device arranged inside the cleaning processing unit 1 in performing the series of the cleaning processing, the initializing processing and the recovery processing of the extra wafers described above. In the cleaning processing system 1, a desired control is performed by an apparatus control section (CPU) 71 on the basis of the recipe set in advance.

A memory 74 is connected to the apparatus control section (CPU) 71. Recorded in the memory 74 are the cleaning recipe corresponding to a prescribed cleaning processing, the initializing recipe corresponding to the initializing processing, and the recovery recipe corresponding to the recovery treatment of the extra wafers. Also, a desired cleaning recipe and the other conditions are selected in an operating section 73 and the signal from the operating section 73 is supplied to the apparatus control section (CPU) 71 so as to allow a recipe controller 72 to select a desired cleaning recipe and to allow the apparatus control section (CPU) 71 to control the various units and the transfer device on the basis of the processing recipe and the information set for the processing.

It is possible to know the position of the wafer W and the direction of the wafer W, i.e., the state as to whether the front surface of the wafer W faces upward or downward, within the cleaning processing system 1 from the histories of the control signals supplied from the apparatus control section (CPU) 71 to the various units and the transfer device and from the signals from the wafer detecting sensors mounted to the wafer transfer device (CRA) 13 and the main wafer transfer device (PRA) 15. The memory 74 stores the histories of the control signals noted above as a wafer information. For storing the wafer information in the memory 74, it is possible to use as required the signals from the wafer detecting sensors mounted to the wafer reversal units (RVS) 14c, 14d and the scrub washing units (SCR) 21a to 21d.

A monitor 75 is connected to the apparatus control section (CPU) 71. It is possible for operator to select a desired cleaning recipe and the other conditions by operating the operating section 73 through the screen of the monitor 75. It is also possible for the monitor 75 to display on the real time basis the situation in respect of the progress in the processing within the cleaning processing system 1 based on the histories of the control signals supplied from the apparatus control section (CPU) to the various units and the transfer device.

A wafer information operating section 76 and a recovery starting section 77, which serve to transfer prescribed signals to the apparatus control section (CPU) 71, are used when the extra wafer present in the cleaning processing system 1 is recovered in the FOUP F during the initializing processing. The wafer information operating section 76 serves to correct, for example, the information relating to the change in the recovery recipe of the extra wafer and to the extra wafer, and the corrected information is supplied to the apparatus control section (CPU) 71. On the other hand, the recovery starting section 77 emits an instruction to start the recovery of the extra wafer to the apparatus control section (CPU) 71.

One mode of the recovery processing of the extra wafer using the control system of the cleaning processing system 1 shown in FIG. 5 will now be described more in detail including the mode as to how to use the wafer information operating section 76 and the recovery starting section 77.

Figures 6, 7:
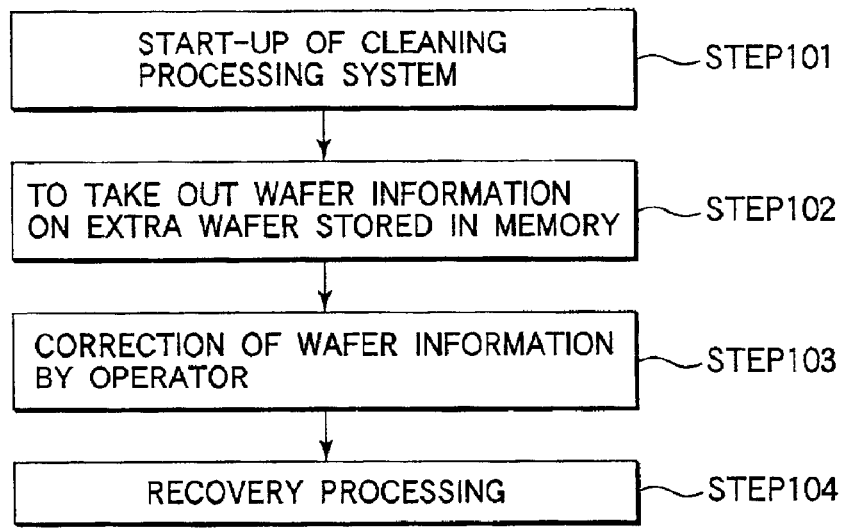
FIG. 6 is a drawing showing as an example the recovery mode of the extra wafer at the start-up time of the cleaning processing system.
FIG. 7 is a drawing schematically showing as an example the contents displayed on a monitor at the start-up time of the cleaning processing system.

FIG. 6 shows one mode of the recovery procedure of the extra wafer. It is assumed in this example that the memory 74, which stores the wafer information concerning the position and direction of the wafer W during processing within the cleaning processing system 1, does not store the information as to whether the front surface of the wafer W taken out of which slot of which FOUP F faces upward or downward in which process unit and does not store the information concerning the hot plate units (HP) 16a to 16c and the cooling unit (COL) 16d. Incidentally, the information on the direction of the extra wafer stored in the memory 74 is judged on the basis of the number of reversing the wafer W in the wafer reversing units (RVS) 14c, 14d.

The first recovery mode of the extra wafer will now be described in the following. First of all, the power supply of the cleaning processing system 1 is turned on so as to start up the operation of the cleaning processing system 1 (step 101). As a result, the recipe of the initializing processing is automatically taken out of the memory 74 so as to carry out the initializing processing of the cleaning processing system 1. In performing the initializing processing, the information on the wafer within the cleaning processing system 1, which was stored in the memory 74 when the power supply to the cleaning processing system 1 was cut off previously, is taken out of the memory 74 and displayed on the monitor 75 (step 102). Further, the recovery recipe of the extra wafer is taken out of the memory 74 so as to be applied to the wafer information taken out of the memory 74. The operator corrects as required the wafer information displayed on the monitor 75 into an appropriate wafer information (step 103), followed by starting the recovery of the extra wafer (step 104).

FIG. 7 schematically shows the image displayed on the monitor 75 as a result of application of the recovery recipe of the extra wafer to the wafer information taken out of the memory 74. Where the wafer information denoting the presence of the extra wafer is taken out of the memory 74, the wafer information is displayed in the column denoting the unit in which the extra wafer is present.

The recovery recipe has in advance the recovery order of the extra wafer from each unit, such as the wafer transfer device (CRA) 13, the main wafer transfer device (PRA) 15 and the scrub washing units (SCR) 21a to 21c in which the extra wafer may present. Consecutive numbers W1, W2, W3, etc. are automatically given to the extra wafers that are actually present in accordance with the recovery order noted above.

In this case, the extra wafer under the state that the front surface faces upward is displayed as, for example, "W1", the extra wafer under the state that the front surface faces downward is displayed as, for example, "W1R", and the extra wafer under the state that it is unknown whether the front surface faces upward or downward is displayed as, for example, "W1?".

Further, it is unknown from which FOUP F the extra wafer was transferred. Therefore, the slot position of the FOUP F into which the extra wafer is recovered is automatically imparted to each extra wafer. In FIG. 7, the extra wafer is recovered in only FOUP F1 among the FOUPs F, and the slot number is displayed as, for example, "S1" after the consecutive number of the wafer.

Incidentally, the display of the extra wafer on the screen of the monitor 75 is not limited to the example given above. It is also possible to use the method of, for example, changing the color of display or using the reversed character.

FIG. 7 shows that a single FOUP F1 alone is disposed on the table 11 and that 15 vacant slots are included in the FOUP F1, i.e., the display of "S: 15". The detection of the FOUP F1 is performed depending on the situation as to whether or not the window section opening/closing mechanism 12 can be operated by the interlock of the window section opening/closing mechanism 12. Also, the detection of the vacant slot is performed by, for example, the wafer detecting device mounted to the window section 92. It is possible for the FOUP F1 to be the FOUP from which the extra wafer was transferred or to be the FOUP prepared exclusively for the recovery of the extra wafer. In this example, the FOUP prepared exclusively for the recovery of the extra wafer constitutes the FOUP F1.

FIG. 7 shows that no wafer number is displayed in the column of "CRA 13", indicating that an extra wafer is not held by the transfer pick 13a of the wafer transfer device (CRA) 13, and that an extra wafer is not present in the wafer transfer units (TRS) 14a, 14b.

FIG. 7 also shows that extra wafers W1 and W2 are present in the scrub washing units (SCR) 21c and 21d, respectively. As described previously, these scrub washing units (SCR) 21c, 21d are used for washing the front surface of the wafer W. In other words, the display shown in FIG. 7 implies that each of these extra wafers W1 and W2 is under the state that the front surface faces upward. Also, these extra wafers W1 and W2 are set to be recovered in the slots 11 and 12 of the FOUP F, respectively.

The extra wafer is not present in the scrub washing unit (SCR) 21a. However, the extra wafer W3 that is to be recovered in the slot 13 of the FOUP F1 is present in the scrub washing unit (SCR) 21b. It is shown that, since the scrub washing unit (SCR) 21b is used for washing the back surface of the wafer W, the extra wafer W3 is displayed as W3R, which indicates that the front surface of the extra wafer W3 faces downward.

Extra wafers W4, W5 that are to be recovered in slots 14, 15, respectively, of the FOUP F1 are present in the wafer reversal units (RVS) 14c and 14d. The extra wafer W5 is displayed as "W5?" indicating that it is unknown whether the front surface of the extra wafer W5 faces upward or downward. This implies that, since it is unknown whether the power supply of the cleaning processing system 1 was cut off before or after the reversing processing, it is unknown whether the front surface of the extra wafer W5 faces upward or downward.

Further, the main wafer transfer device (PRA) 15 holds the extra wafer W6 that is to be recovered in the slot 16 of the FOUP F1. The extra wafer W6 is displayed as "W6?" because it is unknown from which unit the wafer W was transferred and, thus, it is unknown whether the front surface of the extra wafer W6 faces upward or downward.

These extra wafers W1 to W6 are recovered successively into prescribed slots of the FOUP F1 in accordance with the recovery procedure for each process unit described previously. Before the recovery processing, it is necessary to determine the wafer information in respect of the extra wafer whose direction is unknown. Also, where, for example, the operator has manually taken out the extra wafer from within the cleaning processing system 1 during the time when the operation of the cleaning processing system 1 is stopped, the wafer information displayed on the monitor 75 is rendered different from the actual state of the extra wafer present in the cleaning processing system 1, because the wafer information displayed on the monitor 75 is based on the wafer information stored in the memory 74. In such a case, it is necessary to correct the wafer information. Further, it is possible for the situation to take place that, for example, the operator wishes to change the slot into which the extra wafer is to be recovered.

It is possible to compile the wafer information by operating the wafer information operating section 76. For example, in the cleaning processing system 1, it is possible for operator to carry out the compilation of the wafer information, such as "deletion of extra wafers", "addition of extra wafer", "reversal of extra wafer" and "change in slot for recovering extra wafer" by operating the wafer information operating section 76 through the screen of the monitor 75 (step 103 shown in FIG. 6).

The function of deleting the extra wafer is the function of deleting the data on the extra wafer, covering the case where, although the wafer information read from the memory 74 indicates that an extra wafer is present in a certain position, the extra wafer is not actually present in the particular position.

The function of adding the extra wafer is the function of adding the data showing that the extra wafer is present in the particular position, covering the case where, although the wafer information read from the memory 74 indicates that an extra wafer is not present in a certain position, the extra wafer is actually present in the particular position.

The function of reversing the extra wafer is the function of correcting the wafer information so as to display the correct state of the extra wafer, covering the case where the wafer information indicating that the front surface of the extra wafer faces downward is read from the memory 74 and displayed on the monitor 75 in spite of the actual situation that the front surface of the extra wafer faces upward. Similarly, the wafer information is corrected by the function of reversing the extra wafer in the case where the information that the front surface of the extra wafer faces upward is read from the memory 74 and displayed on the monitor 75 in spite of the actual situation that the front surface of the extra wafer faces downward.

Further, the function of changing the slot for recovering the extra wafer is the function of changing the automatically imparted slot position for recovering the extra wafer.

FIG. 8A to 8D show the changes in the display of the monitor 75 in the compiling stage of the data, with the case of using the function of deleting the extra wafer taken up as an example. FIG. 8A shows the initial screen. The wafer information displayed in the initial screen is equal to that shown in FIG. 7. Under the state shown in FIG. 8A, "data compilations" and "wafer recovery" are displayed in the lower columns of the monitor 75. The change of the wafer information in the wafer information operating section 76 can be started by selecting the display of "data compilation". Also, the instruction to start the wafer recovery in the recovery start-up section 77 can be started by selecting the display of "wafer recovery".

For example, where it has been confirmed as a result of the visual observation within the cleaning processing system 1 performed by the operator that the main wafer transfer device (PRA) does not hold the extra wafer W6, the data of the extra wafer W6 is deleted first. If the "data compilation" in the lower column of the monitor 75, which is shown in FIG. 8A, is selected, "wafer deletion", "wafer addition", "reversal of wafer" and "change of slot" are displayed in the lower columns of the monitor 75, as shown in FIG. 8B.

If the number "W6" of the extra wafer that is to be deleted is inputted through a keyboard (not shown) or if the number portion of the extra wafer W6 is toughed on the screen of the monitor 75 after selection of the display "wafer deletion" that is newly displayed, a message confirming the deletion is displayed on the screen as shown in FIG. 8C. If the display "YES" shown in FIG. 8C is toughed, the extra wafer W6 is deleted. As a result, the screen of the monitor 75 is changed to the state shown in FIG. 8D.

It is possible correct the wafer information by the similar dialog type operation in respect of each of "wafer addition", "reversal of wafer" and "change of slot". In the case shown in FIG. 7, it is necessary to confirm the information concerning the extra wafer W5 in the wafer reversal unit (RVS) 14d. The recovery of the extra wafer is started by, for example, toughing the portion of "wafer recovery" shown in FIG. 8A after confirmation of the wafer information so as to make it unnecessary to compile the wafer information.

As a method of the recovery processing of the extra wafer (step 104 shown in FIG. 6), it is possible to use the method in which such operations are applied to all of the extra wafer that, first, "wafer recovery" is selected, and then one of the extra wafer is selected on the screen of the monitor 75, thereby performing the selected extra wafer to be recovered in the prescribed slot.

As another recovery method of the extra wafer, it is possible to control the main wafer transfer device (PRA) 15, etc. such that, if "wafer recover" on the screen of the monitor 75 is selected, the extra wafers are consecutively housed in the prescribed slots in accordance with the recipe of the apparatus control section (CPU) 71.

In the case of consecutively recovering the extra wafers based on the wafer information obtained by correcting the wafer information shown in FIG. 7, the extra wafers W4 and W5 present in the wafer reversal units (RVS) 14c and 14d are housed first in the designated vacant slots 14, 15 because the extra wafer W6 held by the main wafer transfer device (PRA) is already deleted. Then, the extra wafers W1, W2 present in the scrub washing units (SCR) 21c, 21d are housed in the designated vacant slots 11, 12. Finally, the extra wafer W3 present in the scrub washing unit (SCR) 21b is housed in the designated vacant slot 13 so as to finish the recovery treatment of the extra wafers.

After completion of the recovery processing of the extra wafers displayed on the monitor 75, the main wafer transfer device (PRA) 15 takes the extra wafers out of the hot plate units (HP) 16a to 16c and the cooling unit (COL) 16d. In this step, it is confirmed by the wafer detecting sensor mounted to the main wafer transfer device (PRA) 15 whether the extra wafer is held by the main wafer transfer device (PRA) 15. It should be noted that the wafer W is housed inn the hot plate units (HP) 16a to 16c and the cooling unit (COL) 16d under the state that the front surface of the wafer W faces upward. Therefore, where the main wafer transfer device (PRA) detects the extra wafer, the detected extra wafer is transferred to the wafer transfer unit (TRS) 14a or 14b and, then, brought back to a prescribed vacant slot of the FOUP F by the wafer transfer device (CRA) 13.

Incidentally, it is possible to allow the main wafer transfer device (PRA) 15, which does not hold the extra wafer, to gain access to the hot plate units (HP) 16a to 16c and to the cooling unit (COL) 16d, before the recovery processing of the extra wafer displayed on the monitor 75 is started, so as to perform the operation which takes the extra wafers out of these units. As the result, if the main wafer transfer device (PRA) is caused to hold the extra wafer, it is possible to transfer the extra wafers into the vacant wafer transfer units (TRS) 14a, 14b so as to add the wafer information and, thus, to recover these extra wafers in the FOUP F together with the other extra wafer W1, etc.

Also, where a plurality of FOUPs F are disposed on the table 11, it is possible to impart to the wafer information operating section 76 the function to select the FOUP F in which the extra wafer is recovered. It is also possible to classify the extra wafers into a plurality of groups so as to recover the groups of the extra wafers in different FOUPs F such that a certain group of the extra wafers are recovered in a certain FOUP. For example, the system is constructed such that, if the "change of slot" on the screen of the monitor 75 shown in FIG. 8 is selected, the FOUP number and the slot number can be selected in respect of the slot of the FOUP in which the extra wafer is to be recovered. Where the wafer W is already present in the selected slot of the FOUP, it is possible to display an error message so as to prevent the extra wafer from being recovered in the particular slot.

In the case of employing the recovery method of the extra wafer described above, it is possible for the operator to confirm the direction of the wafer W, as required, to recover easily the wafers whose directions are aligned by operating the wafer information operating section 76. As a result, it is possible to prevent the wafer W from being damaged. Also, since it is unnecessary for the operator to manually interchange the wafers W within the FOUP F, the burden given to the operator can be lessened. Further, it is possible to eliminate the artificial mistake in handling the wafer W.

Figure 9:
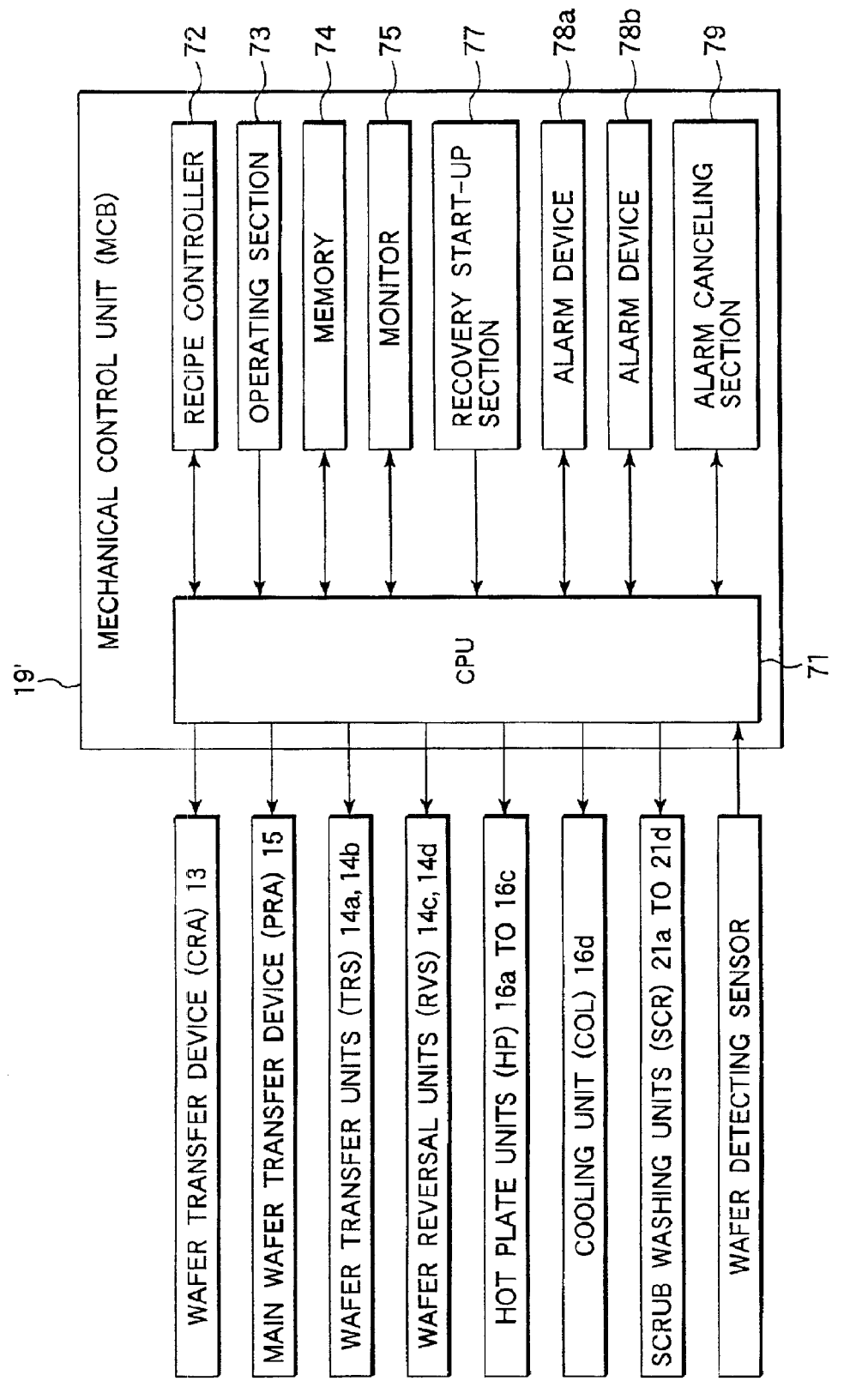
FIG. 9 is a drawing showing as another example the construction of a mechanical control unit (MCB) included in the cleaning processing system.

The construction of a mechanical control unit (MCB) 19', which is another embodiment of the mechanical control unit (MCB) 19 will now be described with reference to FIG. 9. The mechanical control unit 19' is not provided with the wafer information operating section 76 that is included in the mechanical control unit (MCB) 19. However, the mechanical control unit 19' comprises the alarm device 78a, the alarm device 78b and the alarm canceling section 79. In mechanical control unit 19', the apparatus control section (CPU) 71, the recipe controller 72, the operating section 73, the memory 74 and the monitor 75 perform the functions equal to those performed in the mechanical control unit (MCB) 19.

Where the wafer information taken out of the memory 74 in the stage of the initializing processing differs from the position information of extra wafer actually detected by the wafer detecting sensor, the alarm device 78a generates an alarm with respect to each process unit and each transfer device in which the difference is taking place. This alarm enables the operator to know easily the position of the extra wafer so as to make it possible to confirm the wafer information. The alarm can be generated by, for example, the display on the screen of the monitor 75 or the sounds. The alarm device 78a also generates an alarm in the case where vacant lots corresponding to the number of extra wafers to be recovered are not present in the FOUP F.

On the other hand, the alarm device 78b generates an alarm in the case where extra wafers are present in the wafer transfer device (CRA) 13, the main wafer transfer device (PRA) 15 and a specified process unit, e.g., the wafer reversal units (RVS) 14c, 14d and the scrub washing units (SCR) 21a to 21d. By this alarm, access to the process unit in which another extra wafer is present can be inhibited under the state that, for example, the wafer transfer device (CRA) 13 or the main wafer transfer device (PRA) holds an extra wafer. As a result, it is possible to prevent the breakage of the extra wafer and to prevent the wafer transfer device (CRA) 13 or the main wafer transfer device (PRA) 15 from being damaged.

By the alarm indicating that extra wafers are present in the wafer reversal units (RVS) 14c, 14d, the operator is enabled to recognize easily that, even if another extra wafer facing downward is present in another process unit, it is impossible to transfer the particular extra wafer to the wafer reversal units (RVS) 14c, 14c for reversing the extra wafer. It follows that it is possible to prevent the extra wafer from being damaged.

Where extra wafers are present in the scrub washing units (SCR) 21a to 21d, it may be reasonable to understand that the cleaning processing system 1 has been shut down while a cleaning liquid is being supplied to the wafer W. In such a case, it is possible for the extra wafer to be wetted by the cleaning liquid. Where the extra wafer under the particular state is transplanted onto the main wafer transfer device (PRA) 15, the main wafer transfer device (PRA) is rendered wet so as to possibly bring about a malfunction. Therefore, where extra wafers are present in the scrub washing units (SCR) 21a to 21d, the alarm permits the operator to take suitable measures easily such that, after the cleaning processing has been applied to the extra wafer, followed by applying a spin drying to the washed extra wafer, the extra wafer is taken out of the scrub washing units (SCR) 21a to 21d.

Incidentally, where extra wafers are present in the scrub washing units (SCR) 21a to 21b, it is desirable for a rinsing liquid (pure water) to be automatically spurted onto the extra wafer so as to carry out a simple cleaning processing. In this case, a spin drying is applied after the simple cleaning processing.

As described previously, where it is unknown whether the front surface of the extra wafer faces upward or down ward, it is necessary to transfer the extra wafer into the scrub washing units (SCR) 21a, 21b for washing the back surface of the wafer so as to confirm the whether the front surface of the extra wafer faces upward or down ward. However, where extra wafers are already present in the scrub washing units (SCR) 21a, 21b for washing the back surface of the wafer, it is impossible to transfer additional extra wafers present in another process unit or the like into the scrub washing units (SCR) 21a, 21b for washing the back surface of the wafer. The alarm generated from the alarm device 78 allows the operator to recognize easily the particular situation.

The alarm canceling section 79 permits canceling the alarm generated from the alarm devices 78a, 78b. The instruction to recover the extra wafer, which is emitted from the recovery starting section 77, is sent to the apparatus control section (CPU) 71 under the state that all the alarms have been canceled by alarm canceling section 79. In other words, the alarm canceling operation is also the operation of determining the wafer information used in the recovery processing of extra wafer. For example, the alarm delivered from the alarm devices 78a, 78b is displayed on the screen of the monitor 75, and the operation of the alarm canceling section 79 is performed through the screen of the monitor 75 or by a manual operation applied to the keyboard or to the manual operating button of each process unit.

FIG. 10 is a flow chart showing one mode of the recovery procedure of the extra wafer in the case of using the mechanical control unit (MCB) 19'. It is assumed in this case that the memory 74, which certainly stores the information on the position and direction of the wafer when a processing is being carried out in the cleaning processing system 1, does not store the information as to whether the upper surface of the wafer W taken out of which slot of which FOUP F faces upward or down in which unit. Also, the wafer information in the hot plate units (HP) 16a to 16d and the cooling unit (COL) 16d is not stored in the memory 74.

If the power supply of the cleaning processing system 1 is turned on so as to start up the operation of the cleaning processing system 1 (step 201), the initializing processing is started. During the initializing processing, the wafer information on the situation within the cleaning processing system 1, which was stored in the memory 74 when the power supply of the cleaning processing system 1 was cut off previously, is read out of the memory 74 and displayed on the monitor 75 (step 202). Further, the extra wafer s are detected by the wafer detecting sensor (step 203).

As described previously, in the cleaning processing system 1, it is possible to detect the presence or absence of the extra wafer in any of the wafer transfer units (TRS) 14a, 14b, the wafer reversal units (RVS) 14c, 14d, the scrub washing units (SCR) 21a to 21d, the wafer transfer device (CRA) 13 and the main wafer transfer device (PRA) 15 each of which is provided with a wafer detecting sensor. However, the presence or absence of the extra wafer is unknown in respect of the hot plat units (HP) 16a to 16c and the cooling unit (COL) 16d in which a wafer detecting sensor is not arranged.

The wafer information taken out of the memory 74 is checked with the result of detection by the wafer detecting sensor (step 204). Where the wafer information taken out of the memory 74 differs from the result of the detection, the result of detection performed by the wafer detecting sensor is preferentially displayed, and an alarm is generated from the alarm device 78a (step 205). This is because the result of detection performed by the wafer detecting sensor reflects the actual state within the cleaning processing system 1. For example, where the wafer detecting sensor has not detected an extra wafer in a certain position, though the wafer information taken out of the memory 74 indicates that the extra wafer is present in the particular position, it is judged that the extra wafer is not present in the particular position and the result of the judgment is displayed on the screen of the monitor 75.

FIG. 11 schematically shows the state of the screen of the monitor 75, covering the case where the recovery recipe of the extra wafer is applied to the wafer information taken out of the memory 74 and the wafer information detected by the wafer detecting sensor. The recovery recipe used in this case is constructed such that the extra wafers are automatically numbered and housed in the vacant slots in a prescribed FOUP F in the order of the numbering, starting with the uppermost vacant slot.

FIG. 11 shows that three FOUPs F1 to F3 are disposed on the table 11, that the FOUP F1 alone has vacant slots, and that there are 5 vacant slots in the FOUP F1. As described herein later, 6 extra wafers are present in the cleaning processing system 1 and, thus, the vacant slots in the FOUP F1 are incapable of recovering all of these 6 extra wafers. Such being the situation, an alarm is generated from the alarm device 78a.

An extra wafer is not present in any of the wafer transfer device (CRA) 13 and the wafer transfer units (TRS) 14a, 14b. Therefore, an alarm is not generated in respect of the wafer transfer device (CRA) 13.

The display "W1?" shown in FIG. 11 indicates that, although the main wafer transfer device (PRA) 15 holds the extra wafer W1, it is unknown whether the front surface of the extra wafer W1 faces upward or downward. The number "–0" put after "W1?" denotes that the information that the main wafer transfer device (PRA) 15 holds an extra wafer is not included in the wafer information taken out of the memory 74. In other words, the extra wafer W1 is actually present in the main wafer transfer device (PRA) 15 and, it is unknown whether the front surface of the extra wafer W1 faces upward or downward and, thus, the expression "W1?–0" is displayed on the screen of the monitor 75. Also, double alarms, e.g., a flickering display of "W1?–0" and the display by sound, are generated from the alarm devices 78a and 78b in respect of the main wafer transfer device (PRA) 15.

Concerning the extra wafer W1, the extra wafer W1 is transferred into, for example, the scrub washing unit (SCR) 21a in which an extra wafer is not present, and the operator judges whether the front surface of the extra wafer W1 faces upward or downward so as to confirm the wafer information on the extra wafer W1 (step 206). At the same time, the alarm canceling section 79 is operated so as to cancel the alarm from the alarm device 78a. Further, the operation to bring the extra wafer W1 back to the main wafer transfer device (PRA) is performed.

The extra wafer W2 whose front surface faces upward is present in the wafer reversal unit (RVS) 14c, and the extra wafer W3 whose front surface faces downward is present in the wafer reversal unit (RVS) 14d. Therefore, an alarm such as a flickering display of "W2" and "W3R" is generated from the alarm device 78b. Also, the extra wafers W4 and W5 are present in the scrub washing units (SCR) 21c and 21d, respectively, and, thus, an alarm such as a flickering display of "W4" and "W5" is generated from the alarm device 78b. Similarly, the extra wafer W6 whose upper surface faces downward is present in the scrub washing unit (SCR) 21b and, thus, an alarm such as a flickering display of "W6" is generated.

The operator confirms the process unit for which an alarm is generated from the alarm device 78b and cancels the alarm (step 207). Further, since only five vacant slots are included in the FOUP F1, an alarm indicating that it is impossible to recover all the extra wafers W1 to W6 in the FOUP F1 is generated from the alarm device 78a. Therefore, a measure is taken such that the FOUP F1 is taken out of the table 11 and a FOUP F having a required number of vacant slots is substituted for the FOUP F1, thereby canceling the alarm concerning the number of slots for recovering the extra wafers. In this fashion, an instruction to start the recovery of the extra wafers W1 to W6 is supplied from the recovery start-up section 77 to the apparatus control section (CPU) 71 so as to start the recovery operation (step 208). The extra wafers W1 to W6 are automatically carried out in the order of the numbers imparted to the extra wafers.

In the next step, the extra wafers are transferred out of each of the hot plate units (HP) 16a to 16c and the cooling unit (COL) 16d by the main wafer transfer device (PRA) 15. The extra wafers are present in the hot plate units (HP) 16a to 16c and the cooling unit (COL) 16d under the state that the front surfaces of these extra wafers face upward. Therefore, where the main wafer transfer device (PRA) has detected the extra wafers, these extra wafers are transferred into the wafer transfer devices (TRS) 14a and 14b and, then, brought back to the prescribed vacant slots of the FOUP F by the wafer transfer device (CRA) 13.

Figure 12:
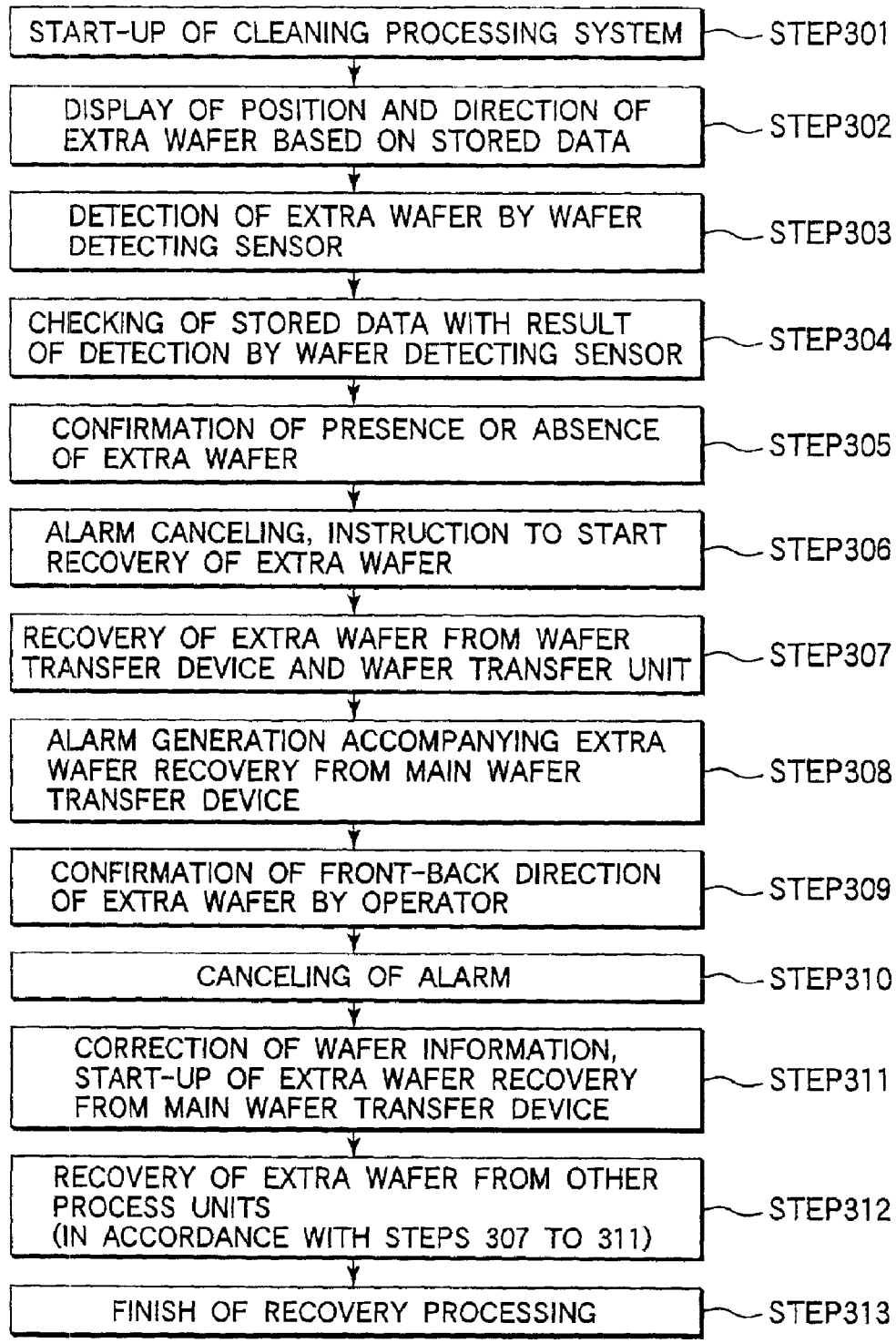
FIG. 12 is a flow chart showing as still another example of the recovery mode of the extra wafer at the start-up time of the cleaning processing system.

The recovery procedure of the extra wafers performed by the mechanical control unit (MCB) 19' can be modified as shown in the flow chart of FIG. 12. In the recovery procedure shown in FIG. 12, although the recovery of the extra wafers is started under the state that the directions of the extra wafers, i.e., the information as to whether the front surface of the extra wafer faces upward or downward, are not confirmed, the presence or absence of the extra wafer is confirmed.

In the first step, the cleaning processing system 1 is started (step 301). As a result, the wafer information stored in the memory 74 concerning the positions and the directions of the extra wafers is displayed on the monitor 75 (step 302). Also, the extra wafers are detected by the wafer detecting sensor (step 303). Further, the wafer information taken out of the memory 74 is checked with the result of the detection by the wafer detecting sensor (step 304).

In the next step, the presence or absence of the extra wafer is confirmed (step 305). Where the wafer information taken out of the memory 74 differs from the result of detection of the extra wafers by the wafer detecting sensor, the result of detection performed by the wafer detecting sensor is employed. In this stage, the presence or absence of the extra wafer is confirmed. However, the state as to whether the front surface of the wafer faces upward or downward has not yet been confirmed in respect of all the extra wafers.

An alarm is generated in the case where the wafer information taken out of the memory 74 differs from the result of detection of the extra wafers performed by the wafer detecting sensor. However, the operator cancels the alarm without confirming the direction of the extra wafer and gives an instruction to start the recovery of the extra wafers (step 306).

The recovery of the extra wafers is carried out in principle in the order of (1) the wafer transfer device (CRA) 13, (2) the wafer transfer units (TRS) 14*a*, 14*b*, (3) the main wafer transfer device (PRA) 15, (4) the wafer reversal units (RVS) 14*c*, 14*c*, (5) the scrub washing units (SCR) 21*a* to 21*d*, (6) the hot plate units (HP) 16*a* to 16*c*, and (7) the cooling unit (COL) 16*d*, as described previously.

For example, it is confirmed that the extra wafers are present in the wafer transfer device (CRA) 13 and the wafer transfer units (TRS) 14*a*, 14*c* under the state that the front surfaces of the extra wafers are allowed to face upward. Therefore, these extra wafers can be recovered easily (step 307). However, where the next main wafer transfer device (PRA) 15 holds an extra wafer, it is unknown whether the front surface of the extra wafer faces upward or downward. Under the circumstances, an alarm is generated (step 308) to permit the operator to confirm the direction of the extra wafer (step 309), followed by canceling the alarm (step 310). The operator corrects the wafer information displayed on the monitor 75 based on the result of the confirming operation so as to allow the main wafer transfer device (PRA) 15 to recover the extra wafer (step 311).

In the next step, where the front surface of the extra wafer clearly faces upward, the extra wafer is recovered with the front surface left to face upward. Also, where the front surface of the extra wafer clearly faces downward, a reversing processing is applied to the extra wafer and, then, the extra wafer is recovered under the state that the front surface of the extra wafer faces upward. Further, where it is unknown whether the front surface of the extra wafer faces upward or downward, the extra wafer is recovered under the state that the front surface of the extra wafer faces upward in accordance with the procedure of steps 308 to 310 (step 312). As a result, the recovery operation of all the wafers is finished (step 313).

The present invention is not limited to the embodiment described above. For example, the embodiment described above covers the case some inconvenience is generated when the recovery of the extra wafer is started on the basis of the wafer information taken out of the memory 74 or the result of detection performed by the wafer detecting sensor. However, where such an inconvenience is not generated, it is possible to recover the extra wafer after completion of the automatic initializing processing.

Further, where the scrub washing units (SCR) 21*a* to 21*d* in the cleaning processing system 1 are classified into the units for washing the front surface of the wafer and the units for washing the back surface of the wafer, it is not necessarily to store the information on the wafer present in the scrub washing units (SCR) 21*a* to 21*d* in the memory 74, but it is possible to confirm the presence or absence and the direction of the extra wafer based on the result of detection by the wafer detecting sensor only.

Further, the front surfaces of the extra wafers held by the transfer pick 13*a* and present in the wafer transfer units (TRS) 14*a*, 14*b* are allowed to face upward without fail. Therefore, it is not necessarily to store the information on the wafer held by the wafer transfer pick 13*a* and present in the wafer transfer units (TRS) 14*a*, 14*b* in the memory 75, but it is possible to confirm the presence or absence and the direction of the extra wafer based on the result of detection by the wafer detecting sensor only.

In other words, if the information on the wafer in the scrub washing units (SCR) 21*a* to 21*d*, the wafer transfer device (CRA) 13 and wafer transfer units (TRS) 14*a*, 14*b* have been stored in the memory 75, it is possible to recover the extra wafers by using the result of the detection by the wafer detecting sensor only without taking out the wafer information of the memory 75.

Further, it is possible to arrange, for example, the alarm devices 78*a*, 78*b* and the alarm canceling section 79, which are arranged in the mechanical control unit (MCB) 19', in the mechanical control section 19 in the cleaning processing system 1. In this case, it is desirable to impart to the alarm canceling section 79 the function of simply canceling the alarm without imparting the function of confirming the wafer information and to allow the wafer operating section 76 to correct and confirm the wafer information. By the particular construction, the operator is enabled to grasp easily the position where the extra wafer is present from the result of the detection by the wafer detecting sensor. Also, the operator is enabled to confirm easily the direction of the wafer W from the wafer information taken out of the memory 74. Also, by the operation of the wafer information operating section 76, the operator is enabled to correct appropriately the wafer information in the process unit or the transfer device for which an alarm is generated so as to change the slot position for recovering the extra wafer and to cancel the alarm by the alarm canceling section 79, thereby starting the recovery of the extra wafers. It follows that the burden given to the operator can be further lessened.

In the explanation given above, the information on the extra wafers concerning the hot plate units (HP) 16*a* to 16*c* and the cooling unit (COL) 16*d* is not displayed on the screen of the monitor 75. However, it is possible to arrange the wafer detecting sensor in each of the hot plate units (HP) 16*a* to 16*c* and the cooling unit (COL) 16*d* or to store the history of the wafer transfer into and out of the hot plate units (HP) 16*a* to 16*d* and the cooling unit (COL) 16*d* in the memory 74 based on the operation of the main wafer transfer device (PRA) 15. As a result, it is possible to recover the extra wafers present in the hot plate units (HP) 16*a* to 16*c* and the cooling unit (COL) 16*d* in the prescribed slots of the prescribed FOUP F in accordance with the procedure similar to that in the case where the extra wafers are present in other process units or the like.

In the description given above, only the information concerning the position and direction of the wafer W is stored in the memory 74 when it comes to the wafers present in the cleaning processing system 1 when the power supply of the cleaning processing system 1 is cut off. Therefore, it is desirable to store in the memory 74 the information as to from which slot of which FOUP F the wafer transfer device (CRA) 13 has taken out a certain wafer W. the information on the direction of the wafer W. which is judged from the number of processing performed in the wafer reversal units (RVS) 14*c*, 14*d*, and the information on the history of the movement of the wafer W within the cleaning processing system 1 in addition to the position and direction of the wafer W noted above. The information on the history of the movement of the wafer W is obtained by storing the movements of the wafer transfer device (CRA) 13 and the main wafer transfer device (PRA) 15 in the memory 74. If these stored information can be taken out in the step of the initializing treatment, it is possible to return the extra wafer into the slot of the original FOUP F.

Where it is clear that the cleaning processing is carried out in accordance with the processing recipe shown in FIG. 4, and where the information on the history of the movement of the wafer W within the cleaning processing system 1 is stored in the memory 74, it is possible to start up again the cleaning processing without the recovery processing of the extra wafers. For example, it is possible to carry out the front surface cleaning processing from the first in respect of the extra wafers present in the scrub washing units (SCR) 21*c*, 21*d* for washing the front surface of the wafers, followed by applying a back surface washing to the extra wafers and the drying the extra wafers in accordance with the processing recipe and, then, housing the extra wafers in the prescribed FOUP F.

When it comes to the extra wafers detected in the scrub washing units (SCR) 21*a*, 21*b* for washing the back surface of the wafer, it is possible for the front surface of the extra wafer to be contaminated. Therefore, it is desirable to bring the extra wafers back to the scrub washing units (SCE) 21*c*, 21*d* for washing the front surface, after application of the spin drying to the extra wafers, for washing again the front surfaces of the extra wafers. In this case, the operation is performed such that the back surfaces are washed again and, then, a drying treatment is applied to the extra wafers, followed by housing the extra wafers in the prescribed slots of the prescribed FOUP F.

Where extra wafers are present in the hot plate units (HP) 16*a* to 16*c* and the cooling unit (COL) 16*d*, the cleaning processing of at least the front surfaces of the extra wafers have already finished. In this case, it is possible to carry out a series of processes starting with the washing of the front surfaces of the extra wafers or to carry out a series of processes starting the washing of the back surfaces of the extra wafers.

In case (a-2) described previously, where the main wafer transfer device (PRA) 15 holds an extra wafer and the front surface of the extra wafer faces downward when the power supply of the cleaning processing system 1 is turned on so as to start the operation of the cleaning processing system 1, and in the case where extra wafers are already present in each of the wafer reversal units (RVS) 14*c*, 14*d*, it is possible to carry out the transfer of the wafer W from the main wafer transfer device (PRA) 15 to the wafer reversal units (RVS) 14*c*, 14*d* as follows.

Specifically, the main wafer transfer device (PRA) 15 has main wafer transfer arms 55, 56 and 57 and, thus, is constructed to be capable of holding three wafers. However, it is considered reasonable to understand that the main wafer transfer device (PRA) 15 does not hold the extra wafer or holds one or two extra wafers when the operation of the cleaning processing system 1 is started again. It is impossible for the main wafer transfer device (PRA) 15 to hold three extra wafers in the stage noted above. It should be noted in this connection that the main wafer transfer device (PRA) 15 performs solely the transplanting operation of the wafer W and, thus, does not hold the extra wafer or holds only one extra wafer in many cases in the stage noted above. The main wafer transfer device (PRA) 15 holds two extra wafers in only the case where the power supply of the cleaning processing system 1 is cut off during the transplanting operation of the wafer W into a certain process unit, in the case where the power supply of the cleaning processing system 1 is cut off before the main wafer transfer device (PRA) 15 transfers the wafer W into another process unit, which is a rare phenomenon.

Therefore, it is possible to carry out the operation of case (a-2) that the extra wafer in any of the wafer reversal units (RVS) 14*c*, 14*d* is received by the vacant arm of the main wafer transfer device (PRA) 15, and the extra wafer is transferred into any of the wafer reversal units (RVS) 14*c*, 14*d*, which is vacant.

As described above, it suffices for the main wafer transfer device (PRA) 15 to hold at most two wafers W in the ordinary operation. Therefore, it is possible for the operation software to be constructed such that the main wafer transfer device (PRA) 15 is capable of holding only up to two wafers. Where the main wafer transfer device (PRA) 15 is capable of holding only up to two wafers, it is possible to stop the recovery in the case where the main wafer transfer device (PRA) 15 holds two extra wafers and an extra wafer is present in any of the wafer reversal units (RVS) 14*c*, 14*d*. Alternatively, it is possible to recover the extra wafers regardless of the state as to whether the front surfaces of the extra wafers are allowed to face upward or down ward. Where the recovery of the extra wafers is stopped, the operator manually carries out the recovery operation. Where the operation software is constructed to permit the main wafer transfer device (PRA) 15 to hold three wafers at a time, it is possible to carry out the operation for case (a-2) under any situation.

In case (b-2) described previously, where extra wafers are present in the wafer reversal units (RVS) 14*c*, 14*d* and it is unknown whether the front surfaces of the extra wafers face upward or downward when the power supply of the cleaning processing system 1 is turned on so as to start the operation of the cleaning processing system 1, and where extra wafers are already present in any of the scrub washing units (SCR) 21*a*, 21*b* for washing the back surface of the wafer, the extra wafers can be recovered as follows.

Specifically, the vacant arm of the main wafer transfer device (PRA) 15 takes an extra wafer out of any of the scrub washing units (SCR) 21*a*, 21 for washing the back surface of the wafer, and transfers the extra wafer present in any of the wafer reversal units (RVS) 14*c*, 14*d* into any of the scrub washing units (SCR) 21*a*, 21*b*, which is vacant, for washing the back surface of the wafer. Under the particular state, the operator visually observes whether the front surface of the extra wafer faces upward or downward. The subsequent steps of the recovery method are as described previously.

If the main wafer transfer device (PRA) is capable of holding three wafers W, it is possible to recover all the extra wafers without fail under the state that the front surfaces of the extra wafers are allowed to face upward even if two extra wafers are present in the main wafer transfer device (PRA) 15, a single extra wafer is present in each of the scrub washing units (SCR) 21*a*, 21*b*, and a single extra wafer is present in each of the wafer reversal units (RVS) 14*c*, 14*d* when the cleaning processing system 1 is restarted.

However, if the operation software is constructed to permit the main wafer transfer device (PRA) 15 to be capable of holding only two wafers, it is impossible to recover all the extra wafers under the state that the front surfaces of the extra wafers are allowed to face upward, if two extra wafers are present in the main wafer transfer device (PRA) 15, a single extra wafer is present in each of the scrub washing units (SCR) 21*a*, 21*b*, and a single extra wafer is present in each of the wafer reversal units (RVS) 14*c*, 14*d*.

In this case, the extra wafer in any of the scrub washing units (SCR) 21*a*, 21*b* is recovered by the operator himself so as to make any of the scrub washing units (SCR) 21a, 21b vacant, with the result that the other extra wafers can be recovered under the state that the front surfaces of the extra wafers are allowed to face upward. Incidentally, the scrub washing units (SCR) 21a, 21b are arranged on the outer side and in the lower stage of the wash treating system 1 and, thus, it is possible for the operator to take the extra wafer out of any of the scrub washing units (SCR) 21a, 21b easily. On the other hand, the wafer reversal units (RVS) 14c, 14d are positioned in the central portion of the cleaning processing system 1 and, thus, it is troublesome for the operator to take the extra wafers out of the wafer reversal units (RVS) 14c, 14d.

For example, where there is a process unit in which an inconvenience takes place because of, for example, the suspension of the air supply for driving the unit, the suspension of the supply of a process liquid or the suspension of the power supply to the unit, even if an initializing processing is applied to the cleaning processing system 1 after the power supply of the cleaning processing 1 is turned on, it is impossible to apply an initializing processing to the particular process unit. As a result, an undesirable situation takes place that, even if an extra wafer is present in the particular process unit, it is impossible to recover the extra unit. In such a case, a first recovery processing is applied to the extra wafer, which is present in the process unit except the process unit to which the initializing processing has not yet been applied and which can be recovered. Then, the operator manually corrects the inconvenience taking place in the process unit without turning off the power supply of the apparatus and, then, an initializing processing is carried out again without turning off the power supply of the apparatus. As a result, it is made possible to carry out a second recovery operation of the extra wafer present in the cleaning processing system 1. By taking the particular procedure described above, it is possible to recover all the extra wafers without turning off the power supply of the apparatus after the power supply of the cleaning processing system 1 is turned on so as to start the operation of the cleaning processing system 1.

The information on the position and direction of the wafer W is stored in the memory 74. In addition, it is possible to store in the memory 74 the information as to from which slot of which FOUP F the wafer W was taken out. In recovering the extra wafer, it is possible to determine the slot of the FOUP F for recovering the extra wafer based on the particular information. For example, it is possible to recover the extra wafer in the slot from which the wafer was taken out previously, in the slot designated by the operator, or in the prescribed slot allotted by the apparatus control section (CPU) 71 in accordance with the recovery recipe.

In the description given above, a semiconductor wafer is taken up as the substrate that is handled. Alternatively, it is possible for the substrate to be, for example, an LCD substrate. Also, it is possible to apply the substrate processing apparatus and the substrate processing method of the present invention to, for example, a resist coating process apparatus and a developing process apparatus as well as to an apparatus and method for processing both surfaces of a substrate.

It should be noted that the embodiments described above are simply intended to clarify the technical idea of the present invention. Naturally, the technical scope of the present invention should not be construed solely on the basis of the specific embodiments described above. In other words, the present invention can be worked in variously modified fashions on the basis of the spirit of the present invention and within the scope defined in the accompanying claims.

What is claimed is:

1. A substrate processing apparatus, comprising:

an apparatus body for applying a prescribed processing to a substrate, the substrate being reversed inside said apparatus body by a reversal unit;

substrate transfer means for transferring the substrate inside said apparatus body;

substrate detecting means for detecting the substrate present inside said apparatus body;

memory means for storing information concerning the position and direction of the substrate present inside said apparatus body when the power supply of said apparatus body is cut off and for taking out the stored information when the power supply of said apparatus body is turned on again;

alarm means for checking the information detected by said substrate detecting means with the information taken out of said memory means when the power supply of said apparatus body is turned on so as to generate an alarm when the detected information and the information taken out of said memory means differ from each other;

alarm canceling means for canceling said alarm;

control means for controlling said substrate transfer means to permit the substrate present inside said apparatus body to be recovered in a prescribed position outside said apparatus body; and recovery start-up means for emitting an instruction to start the substrate recovery to said control means, after the alarm is canceled by said alarm canceling means and after it has been confirmed that the substrate present inside said apparatus body is recovered under the state that the substrate faces in a prescribed direction.

2. The substrate processing apparatus according to claim 1, wherein:

said alarm canceling means comprises information correcting means for correcting the information on the substrate for which an alarm has been generated from said alarm means so as to confirm the substrate information and for canceling said alarm after confirmation of the substrate information; and said control means controls said substrate transfer means so as to permit the substrate present inside said apparatus body to be recovered in a prescribed position outside the apparatus body based on the substrate information confirmed by said information correcting means.

3. The substrate processing apparatus according to claim 2, wherein said information correcting means capable of deleting said data in the case where data indicating that the substrate is present in a prescribed position is taken out of said memory means in spite of the situation that said substrate detecting means does not detect the substrate in said prescribed position, adding data indicating the state of the substrate present in said prescribed position in the case where data indicating that the substrate is not present in a prescribed position is taken out of said memory means in spite of the situation that said substrate detecting means has detected the substrate in said prescribed position, or correcting data in the case where the data concerning the direction of the substrate present in a prescribed position, said data being taken out of said memory means, differs from the actual direction of the substrate.

4. The substrate processing apparatus according to claim 1, wherein said control means controls said substrate transfer means such that all the substrates inside said apparatus body are successively recovered in prescribed positions outside the apparatus body after it has been confirmed that all the substrates are recovered under the state that the substrates face in a prescribed direction.

5. A substrate processing apparatus, comprising:

an apparatus body for applying a prescribed processing to a substrate, the substrate being reversed inside said apparatus body by a reversal unit;

substrate transfer means for transferring the substrate inside said apparatus body;

memory means for storing information concerning the position and direction of the substrate present inside said apparatus body when the power supply of said apparatus body is cut off and for taking out the stored information when the power supply of said apparatus body is turned on again;

information operating means for obtaining the information taken out of said memory means when the power supply of said apparatus body is turned on;

control means for controlling said substrate transfer means based on the substrate information obtained by said information operating means so as to permit the substrate to be recovered in a prescribed position outside said apparatus body; and recovery start-up means for emitting an instruction to start the substrate recovery to said control means, after it has been confirmed that the substrate present inside said apparatus body is recovered under the state that the said substrate faces in a prescribed direction.

6. The substrate processing apparatus according to claim 5, wherein said information operating means is capable of deleting the data indicating that the substrate is present in a prescribed position taken out of said memory means, adding data indicating that the substrate is present in a prescribed position in the case where data indicating that the substrate is not present in said prescribed position is taken out of said memory means, or correcting data in the case where the data concerning the direction of the substrate present in a prescribed position, said data being taken out of said memory means, differs from the actual direction of the substrate.

7. The substrate processing apparatus according to claim 5, wherein said control means controls said substrate transfer means such that all the substrates inside said apparatus body are successively recovered in prescribed positions outside the apparatus body after it has been confirmed that all the substrates are recovered under the state that the substrates face in a prescribed direction.

8. A substrate processing apparatus for applying a prescribed processing to a substrate, comprising:

a container loading/unloading section for loading and unloading a container capable of housing a plurality of substrates a prescribed distance apart from each other;

an apparatus body including a substrate processing section having a liquid processing unit for applying a prescribed liquid processing to the front surface or back surface of the substrate and a reversal unit for reversing the substrate, and a substrate transfer section for transferring the substrate between said container loading/unloading section and said substrate processing section;

a first substrate transfer device for transferring the substrate in said substrate processing section;

a second substrate transfer device for transferring the substrate in said substrate transfer section;

substrate detecting means for detecting the substrate present inside said apparatus body;

memory means for storing the information concerning the position and direction of the substrate present inside said apparatus body when the power supply of said apparatus body is cut off and taking out the stored information when the power supply of said apparatus body is turned on again;

alarm means for checking the information detected by said substrate detecting means with the information taken out of said memory means when the power supply of said apparatus body is turned on so as to generate an alarm when the detected information and the information taken out of said memory means differ from each other;

alarm canceling means for canceling said alarm;

control means for controlling said first substrate transfer device and said second substrate transfer device so as to permit the substrate present inside said apparatus body to be recovered in a container arranged in said container loading/unloading section; and recovery start-up means for emitting an instruction to start the substrate recovery to said control means, after the alarm is canceled by said alarm canceling means and after it has been confirmed that the substrate inside said apparatus body is recovered under the state that the substrate faces in a prescribed direction.

9. The substrate processing apparatus according to claim 8, wherein said alarm means generates an alarm in the case where said substrate detecting means has detected a substrate in said liquid processing unit, said reversal unit, said first substrate transfer device or said second substrate transfer device when the power supply of said apparatus body is turned on.

10. The substrate processing apparatus according to claim 8, wherein said control means automatically determines the recovery procedure of the substrate and the substrate-housing slot in the container for housing the substrate in the case where there is no abnormality in the result of the checking of the information detected by said substrate detecting means with the information taken out of said memory means so as to control said first substrate transfer device and said second substrate transfer device in accordance with an instruction given from said recovery start-up means for recovering the substrate.

11. The substrate processing apparatus according to claim 8, wherein:

said alarm canceling means includes information correcting means for correcting the information on the substrate for which an alarm has been generated from said alarm means so as to confirm the substrate information and for canceling said alarm after confirmation of the substrate information; and said control means controls said first substrate transfer device and said second substrate transfer device based on the substrate information confirmed by said information correcting means so as to permit the substrate present in said apparatus body to be recovered in a container disposed in said container loading/unloading section.

12. The substrate processing apparatus according to claim 11, wherein said information correcting means is capable of deleting data in the case where data indicating that the substrate is present in a prescribed position is taken out of said memory means in spite of the situation that said substrate detecting means does not detect the substrate in said prescribed position, adding data indicating the state of the substrate present in said prescribed position in the case where data indicating that the substrate is not present in a prescribed position is taken out of said memory means in spite of the situation that said substrate detecting means has detected the substrate in said prescribed position, or correcting data, changing the substrate-housing slot in the container for housing the substrate, or changing the order of recovery of the substrate in the case where the data concerning the direction of the substrate present in a prescribed position said data being taken out of said memory means, differs from the actual direction of the substrate.

13. The substrate processing apparatus according to claim 11, wherein said information correcting means includes a monitor capable of displaying the information taken out of said memory means and is capable of compiling the information displayed on said monitor on the screen of the monitor thereby transferring an instruction to recover the substrate generated from said recovery start-up means to said control means.

14. The substrate processing apparatus according to claim 8, wherein said memory means judges the direction of the substrate present in said substrate processing section depending on the number of times of reversing the substrate by said reversal unit.

15. The substrate processing apparatus according to claim 8, wherein said control mean controls said substrate transfer means and said reversal unit such that the substrate present in said apparatus body is recovered in the container disposed on said container loading/unloading section under the state that the front surface of the substrate faces upward.

16. The substrate processing apparatus according to claim 8, wherein said liquid processing unit is a single wafer type cleaning unit for applying a cleaning processing to the front surface or back surface of the substrate, a plurality of said single wafer type cleaning units being stacked one upon the other to form a stacked structure.

17. The substrate processing apparatus according to claim 8, wherein said substrate processing section includes a thermal processing unit for applying a prescribed thermal processing to the substrate to which a liquid processing has been applied in said liquid processing unit.

18. The substrate processing apparatus according to claim 17, wherein said thermal processing unit includes a heat treating unit for applying a heat treatment to the substrate and a cooling process unit for cooling the substrate subjected to the heat treatment in said heating process unit.

19. A substrate processing apparatus for applying a prescribed processing to a substrate, comprising:

a container loading/unloading section for loading and unloading a container capable of housing a plurality of substrates a prescribed distance apart from each other;

an apparatus body including a substrate processing section having a liquid processing unit for applying a prescribed liquid processing to the front surface or back surface of the substrate and a reversal unit for reversing the substrate, and a substrate transfer section for transferring the substrate between said container loading/unloading section and said substrate processing section;

a first substrate transfer device for transferring the substrate in said substrate processing section;

a second substrate transfer device for transferring the substrate in said substrate transfer section;

memory means for storing the information concerning the position and direction of the substrate present inside said apparatus body when the power supply of said apparatus body is cut off and for taking out the stored information when the power supply of said apparatus body is turned on again;

information operating means for operating the information taken out of said memory means when the power supply of said apparatus body is turned on;

control means for controlling said first substrate transfer device and said second substrate transfer device so as to permit the substrate present inside said substrate body to be recovered in a container arranged in said container loading/unloading section on the basis of the substrate information obtained by said information operating means; and recovery start-up means for emitting an instruction to start the substrate recovery to said control means, after it has been confirmed that the substrate present inside said apparatus body is recovered under the state that the substrate faces in a prescribed direction.

20. The substrate processing apparatus according to claim 19, wherein said information operating means is capable of deleting data taken out of said memory means and indicating that the substrate is present in said prescribed position, adding data indicating that, where data indicating that a substrate is not present in a prescribed position is taken out of said memory means, the substrate is present in said prescribed position, or correcting data, changing the substrate-housing slot in the container for housing the substrate, or changing the order of recovery of the substrate in the case where the data concerning the direction of the substrate present in a prescribed position, said data being taken out of said memory means, differs from the actual direction of the substrate.

21. The substrate processing apparatus according to claim 19, wherein said information operating means includes a monitor capable of displaying the information taken out of said memory means and is capable of compiling the information displayed on said monitor on the screen of the monitor thereby transferring an instruction to recover the substrate generated from said recovery start-up means to said control means.

22. The substrate processing apparatus according to claim 19, wherein said memory means judges the direction of the substrate present in said substrate processing section depending on the number of times of reversing the substrate by said reversal unit.

23. The substrate processing apparatus according to claim 19, wherein said control means controls said substrate transfer means and said reversal unit such that the substrate present in said apparatus body is recovered in the container disposed on said container loading/unloading section under the state that the substrate faces upward.

24. The substrate processing apparatus according to claim 19, wherein said liquid processing unit is a single wafer type cleaning unit for applying a cleaning processing to the front surface or back surface of the substrate, a plurality of said single wafer type cleaning units being stacked one upon the other to form a stacked structure.

25. The substrate processing apparatus according to claim 19, wherein said substrate processing section includes a thermal processing unit for applying a prescribed thermal processing to the substrate to which a liquid processing has been applied in said liquid processing unit.

26. The substrate processing apparatus according to claim 25, wherein said thermal processing unit includes a heat treating unit for applying a heat treatment to the substrate and a cooling process unit for cooling the substrate subjected to the heat treatment in said heating process unit.

27. A substrate processing apparatus, comprising:

an apparatus body for applying a prescribed processing to a substrate, the substrate being reversed within said apparatus body by a reversal unit;

substrate transfer means for transferring the substrate within said apparatus body;

substrate detecting means for detecting the substrate present inside said apparatus body;

control means for determining the operation of said substrate transfer means to recover the substrate in a prescribed position outside said apparatus body in the case where said substrate detecting means has detected the substrate within said apparatus body when the power supply of said apparatus body is turned on; and recovery start-up means for emitting an instruction to start the recovery of the substrate present inside said apparatus body to said control means, after it has been confirmed that the substrate present inside said apparatus body is recovered under the state that the substrate faces in a prescribed direction.

28. A substrate processing apparatus for applying a prescribed processing to a substrate, comprising:

a container loading/unloading section for loading and unloading a container capable of housing a plurality of substrates a prescribed distance apart from each other;

an apparatus body including a substrate processing section having a liquid processing unit for applying a prescribed liquid processing to the front surface or back surface of a substrate and a reversal unit for reversing the substrate to permit the front surface or the back surface of the substrate to face upward, and a substrate transfer section for transferring the substrate between said container loading/unloading section and said substrate processing section;

a first substrate transfer device for transferring the substrate within said substrate processing section;

a second substrate transfer device for transferring the substrate within said substrate transfer section;

substrate detecting means for detecting the substrate present inside said apparatus body;

control means for determining the operation of said first substrate transfer device and said second substrate transfer device to recover the substrate in a container disposed within said container loading/unloading section in the case where said substrate detecting means has detected the substrate within said apparatus body when the power supply of said apparatus body is turned on; and recovery handling means for emitting an instruction to start the recovery of the substrate present inside said apparatus body to said control means, after it has been confirmed that the substrate present inside said substrate processing section is recovered under the state that the substrate faces in a prescribed direction.

* * * * *